(12) United States Patent
Dai et al.

(10) Patent No.: US 10,447,432 B2
(45) Date of Patent: Oct. 15, 2019

(54) METHOD FOR POLAR CODING IN COMMUNICATION NETWORK

(71) Applicant: HUAWEI TECHNOLOGIES CO., LTD., Shenzhen, Guangdong (CN)

(72) Inventors: Shengchen Dai, Hangzhou (CN); Huazi Zhang, Hangzhou (CN); Rong Li, Hangzhou (CN); Yunfei Qiao, Hangzhou (CN); Yue Zhou, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/354,194

(22) Filed: Mar. 15, 2019

(65) Prior Publication Data

US 2019/0215099 A1    Jul. 11, 2019

Related U.S. Application Data

(63) Continuation of application No. PCT/CN2018/087183, filed on May 16, 2018.

(30) Foreign Application Priority Data

Jun. 19, 2017    (CN) .......................... 2017 1 0465743

(51) Int. Cl.
    *H04L 1/00*        (2006.01)
    *H03M 13/00*    (2006.01)

(52) U.S. Cl.
    CPC .......... *H04L 1/0041* (2013.01); *H04L 1/0057* (2013.01); *H04L 1/0061* (2013.01); *H04L 1/0068* (2013.01)

(58) Field of Classification Search
    None
    See application file for complete search history.

(56) References Cited

U.S. PATENT DOCUMENTS

| 9,628,113 B2 | 4/2017 | Jeong et al. |
| 2002/0194571 A1 | 12/2002 | Parr et al. |

(Continued)

FOREIGN PATENT DOCUMENTS

| CN | 103281166 A | 9/2013 |
| CN | 103684477 A | 3/2014 |

(Continued)

OTHER PUBLICATIONS

Tingting Fan et al.,"A joint design of physical layer network coding and Polar code in two-way relay Channel",Journal of Harbin Institute of Technology,vol. 48 No. 5,dated May 2016,total 6 pages.

(Continued)

*Primary Examiner* — Justin R Knapp
(74) *Attorney, Agent, or Firm* — Huawei Technologies Co., Ltd.

(57) ABSTRACT

Embodiments of this application provide a method for processing information bits in a wireless communication network. A communication device obtains K information bits and a code length M. The code length M is a length of an output sequence resulting from processing the information bits. The communication device generates an N-bit bit sequence that includes the K information bits and one or more parity check bits, encodes the bit sequence using a polar encoding formula to obtain an N-bit encoded sequence, rate matches the encoded sequence to obtain the output sequence, and outputs the output sequence. When M−K>192, in the bit sequence, one of the parity check bits is placed in a bit position that is determined according to reliabilities of the bit positions in the bit sequence for placing the K information bits and the one or more parity check bits.

19 Claims, 9 Drawing Sheets

(56) References Cited

U.S. PATENT DOCUMENTS

| | | | |
|---|---|---|---|
| 2009/0307562 | A1 | 12/2009 | Lee et al. |
| 2012/0207224 | A1 | 8/2012 | Chow et al. |
| 2013/0094605 | A1 | 4/2013 | Larsson |
| 2014/0208183 | A1 | 7/2014 | Mahdavifar et al. |
| 2014/0281823 | A1 | 9/2014 | Micheloni et al. |
| 2015/0039966 | A1 | 2/2015 | Fonseka et al. |
| 2015/0169094 | A1 | 6/2015 | Liu et al. |
| 2015/0194987 | A1 | 7/2015 | Li et al. |
| 2015/0249473 | A1 | 9/2015 | Li et al. |
| 2016/0204811 | A1 | 7/2016 | Goela et al. |
| 2017/0366206 | A1* | 12/2017 | Zhang ............... H03M 13/13 |
| 2018/0034587 | A1 | 2/2018 | Kim et al. |
| 2018/0076929 | A1 | 3/2018 | Zhang et al. |
| 2018/0367250 | A1* | 12/2018 | Li ................. H03M 13/618 |
| 2019/0044540 | A1* | 2/2019 | Jiang ............... H03M 13/136 |

FOREIGN PATENT DOCUMENTS

| | | | |
|---|---|---|---|
| CN | 103792570 | A | 5/2014 |
| CN | 103825669 | A | 5/2014 |
| CN | 105743621 | A | 7/2016 |
| CN | 105811998 | A | 7/2016 |
| CN | 106100795 | A | 11/2016 |
| CN | 106685434 | A | 5/2017 |
| CN | 107425857 | A | 12/2017 |
| JP | 2016224679 | A | 12/2016 |
| KR | 20050040478 | A | 5/2005 |
| WO | 2014092502 | A1 | 6/2014 |
| WO | 2014102565 | A1 | 7/2014 |

OTHER PUBLICATIONS

3GPP TS 36.212 V14.2.0 (Mar. 2017),3rd Generation Partnership Project;Technical Specification Group Radio Access Network;Evolved Universal Terrestrial Radio Access (E-UTRA);Multiplexing and channel coding(Release 14),total 197 pages.

3GPP TS 38.212 V0.0.0 (May 2017),3rd Generation Partnership Project;Technical Specification Group Radio Access Network;NR;Multiplexing and channel coding(Release 15),total 10 pages.

Arikan, Erdal, "Channel Polarization:A Method for Constructing Capacity-Achieving Codes for Symmetric Binary-Input Memoryless Channels," IEEE Transactions on Information Theory, vol. 55, No. 7, Jul. 2009, pp. 3051-3073.

Huawei et al., "Polar code design and rate matching",3GPP TSG RAN WG1 Meeting #86 R1-167209,Gothenburg, Sweden, Aug. 22-26, 2016,total 5 pages.

Catt, "Performance of coding candidates for NR control channel",3GPP TSG RAN WG1 Meeting #87 R1-1611402, Reno, USA Nov. 14-18, 2016,total 5 pages.

Spreadtrum Communications,"Comparison of Polar and LDPC with short information length for eMBB scenario",3GPP TSG RAN WG1 meeting #87 R1-1611478,Reno, USA, Nov. 14-18, 2016,total 4 pages.

Qualcomm Incorporated, "Implementation for short blocks in EMBB",3GPP TSG-RAN WG1 #87 R1-1612085, Nov. 14-18, 2016,Reno, USA,total 7 pages.

Qualcomm Incorporated, "Control channel performance",3GPP TSG-RAN WG1 #87 R1-1612088, Nov. 14-18, 2016,Reno, USA,total 9 pages.

MediaTek Inc., "Comparison of coding candidates for eMBB data channel of short codeblock length",3GPP TSG RAN WG1 Meeting #87 R1-1612134,Reno, USA, Nov. 14-18, 2016,total 9 pages.

Nokia et al., "Selection criteria for short block eMBB data",3GPP TSG-RAN WG1 #87 R1-1612275,Reno, U.S.A., Nov. 14-18, 2016,total 5 pages.

Samsung,"Discussion on Polar Codes for NR",3GPP TSG RAN WG1 #87 R1-1612552,Reno, Nevada, US, Nov. 14-18, 2016,total 7 pages.

Intel ,"Discussion on EMBB data channel coding for block lengths less than X",3GPP TSG RAN WG1 Meeting #87 R1-1612585,Reno, USA Nov. 14-18, 2016,total 7 pages.

Intel Corporation,"Discussion on Control channel coding for NR",3GPP TSG RAN WG1 Meeting #87 R1-1612587, Reno Nevada, Nov. 14-18, 2016,total 4 pages.

Coherent Logix Inc.,"Polar Decoder Implementation on Memory-In-Network Processor based DSP",3GPP TSG RAN WG1 Meeting #87 R1-1613005,Reno, USA, Nov. 14-18, 2016,total 7 pages.

Niu Cal et al.,"Polar Codes: Primary Concepts and Practical Decoding Algorithms," IEEE Communications Magazine, Jul. 2014, No. 7, vol. 52, ISSN:0163-6804, pp. 193-203.

Huawei et al.,"Channel coding schemes for mMTC scenario",3GPP TSG RAN WG1 Meeting #86 R1-167215, Gothenburg, Sweden, Aug. 22-26, 2016,total 9 pages.

Coherent Logix Inc.,"Polar Decoder Implementation on Memory-In-Network Processor based DSP",3GPP TSG RAN WG1 Meeting #87 R1-1613018,Reno, USA, Nov. 14-18, 2016,total 7 pages.

Huawei, HiSilicon,"Polar code design and rate matching",3GPP TSG RAN WG1 Meeting #86 R1-167209,Gothenburg, Sweden, Aug. 22-26, 2016,total 5 pages.

Huawei et al.,"Channel coding for control channels",3GPP TSG RAN WG1 Meeting #86 R1-167216,Gothenburg, Sweden, Aug. 22-26, 2016,total 8 pages.

Huawei, HiSilicon,"Channel coding schemes for mMTC scenario",3GPP TSG RAN WG1 Meeting #86 R1-167215, Gothenburg, Sweden, Aug. 22-26, 2016,total 9 pages.

Huawei et al.,"Polar Code Construction for NR",3GPP TSG RAN WG1 Meeting #86bis R1-1608862,Lisbon, Portugal, Oct. 10-14, 2016,total 8 pages.

Huawei, HiSilicon,"Channel coding for control channels",3GPP TSG RAN WG1 Meeting #86 R1-167216,Gothenburg, Sweden, Aug. 22-26, 2016,total 8 pages.

Zte et al.,"Evaluation on Channel Coding Candidates for uRLLC and mMTC",3GPP TSG RAN WG1 Meeting #87 R1-1611108,Reno, USA Nov. 14-18, 2016,total 6 pages.

Zte et al.,"Evaluation on Channel coding candidates for eMBB control channel",3GPP TSG RAN WG1 #87 R1-1611109,Reno, USA Nov. 14-18, 2016,total 16 pages.

Ericsson,"Consideration of Implementation Aspects of Polar Codes",3GPP TSG RAN WG1 Meeting #87 R1-1611318, Reno, USA Nov. 14-18, 2016,total 6 pages.

Ericsson,"Channel Coding Candidates for Control Channel",3GPP TSG RAN WG1 Meeting #87 R1-1611326,Reno, USA Nov. 14-18, 2016,total 7 pages.

Catt,"Evaluation of channel coding schemes with short block size for eMMB",3GPP TSG RAN WG1 Meeting #87 R1-1611401,Reno, USA Nov. 14-18, 2016,total 8 pages.

Huawei, HiSilicon,"Polar Code Construction for NR",3GPP TSG RAN WG1 Meeting #86bis R1-1608862, Lisbon, Portugal, Oct. 10-14, 2016,total 8 pages.

* cited by examiner $(u_7, u_8)$=CRC_encode $(u_1+u_2+u_3+u_4)$

METHOD FOR POLAR CODING IN COMMUNICATION NETWORK

CROSS-REFERENCE TO RELATED APPLICATIONS

This application is a continuation of International Application No. PCT/CN2018/087183, filed on May 16, 2018, which claims priority to Chinese Patent Application No. 201710465743.X, filed on Jun. 19, 2017. The disclosures of the aforementioned patent applications are hereby incorporated by reference in their entireties.

TECHNICAL FIELD

Embodiments of the application relate to the field of communications, and more specifically, to method and apparatus for coding information in a communication network.

BACKGROUND

In communication systems, channel coding to be transmitted information can prevent interferences occurred in information transmissions, and ensure information or data reliably transmitted to a receiving device. Normally, a sending device encodes the information or data to obtain encoded bits, interleaves the encoded bits, maps the interleaved bits to modulation symbols, and processes and sends the modulation symbols through a communication channel. After receiving the modulation symbols, a receiving device recovers the information or data through a decoding process.

In communication systems using different radio access technologies, different coding schemes are used in order to adapt to different application scenarios.

In a current long term evolution (LTE) protocol, when a length of an information bit sequence carrying uplink control information is greater than or equal to 12 bits and less than or equal to 22 bits, coding is performed using dual LTE-Reed Muller (RM) code (refer to 3GPP TS 36.212 Section 5.2.2 to Section 5.2.4 for details). Recently, in the RAN1#88bis meeting of New Radio (NR), it is agreed that, in the fifth generation (5G) NR schemes, when a length of an information bit sequence is greater than or equal to 12 and less than or equal to 22, the information bit sequence is encoded using a polar code. Polar code is a coding scheme that can gradually reach a channel capacity, and it has excellent decoding performance in wide range of parameters (e.g. code length, bit rate, and signal-to-noise ratio).

In existing polar code coding schemes, parity check (PC) polar code has relatively good performance in terms of code distance and block error rate (BLER) when a successive cancellation list (SCL) algorithm is used, hence having good application potential. In the PC polar coding, an information bit sequence includes K information bits and one or more check bits. Positions of the check bits in the sequence is randomly selected in reliability order, and positions of the K information bits are sequentially selected in descending order of reliability. Therefore, in the PC polar coding, reliabilities of the positions filled by the check bits cannot be ensured, and overall performance of the polar coding scheme may be affected.

SUMMARY

Embodiments of the application provide a polar code encoding/decoding method and apparatus, to optimize a manner for determining check bit positions, and improve overall polar code performance.

According to a first aspect, embodiments of this application provides an encoding method, including:

determining information bit positions, and determining check bit positions to be inserted into the information bits, wherein the check bit positions and the information bit positions are determined in reliability order of polar channels and/or in row weight order, the reliability is reliability of polar channels on which the bit positions are located, and the row weights are row weights of row vectors in a polar code generator matrix that are corresponding to the polar channels; and polar encoding or polar decoding based on the information bit positions and the check bit positions.

Compared with the prior art, in this application, the check bit positions are determined to a reliability sorting and/or in row weight order, to ensure that reliability of the determined check bit positions is higher than reliability of check bit positions determined in the prior art.

In a possible design, the check bit positions and the information bit positions determined according to any one of Set 1 to Set 243, and any one of Set 1 to Set 243 includes a plurality of check equations or check functions. If the check equation is obtained by sequentially arranging at least two elements, a last element indicates a check bit position, and one or more remaining elements indicate information bit positions checked by using the check bit.

In a possible design, the determining information bit positions of to-be-encoded information bits, and determining check bit positions of check bits to be inserted into the information bits includes:

determining a plurality of bit positions based on the reliability and/or the row weights, and determining the check bit positions and the information bit positions from the plurality of bit positions, where the plurality of bit positions are determined from most reliable bit positions in descending order of the reliability of the polar channels; or the plurality of bit positions are determined in row weight order of the generator matrix from bit positions corresponding to row vectors whose row weights meet an integral multiple of a minimum row weight; or some of the plurality of bit positions are determined from most reliable bit positions in descending order of the reliability of the polar channels, and the rest of the plurality of bit positions are determined in row weight order of the generator matrix from bit positions corresponding to row vectors whose row weights meet an integral multiple of a minimum row weight.

In a possible design, the determining the check bit positions and the information bit positions from the plurality of bit positions includes:

the plurality of bit positions are in a first bit position set and a second bit position set, both the first bit position set and the second bit position set are determined from the most reliable bit positions in descending order of the reliability of the polar channels, and the first bit position set includes the bit positions corresponding to the row vectors whose row weights meet the integral multiple of the minimum row weight;

obtaining a first optimization parameter and a second optimization parameter, where the first optimization parameter indicates a quantity of bit positions in the first bit position set that are configured as check bit positions, the second optimization parameter indicates a quantity of bit positions in the second bit position set that are configured as check bit positions, and a sum of the first optimization parameter and the second optimization parameter is equal to a total quantity of check bits inserted into the information bits;

determining, from the first bit position set, bit positions that meet the first optimization parameter, determining, from the second bit position set, bit positions that meet the second optimization parameter, and using the determined bit positions as the check bit positions; and determining the information bit positions from bit positions in the first bit position set or the second bit position set that are not determined as the check bit positions.

In a possible design, the determining, from the first bit position set, bit positions that meet the first optimization parameter includes:

obtaining a third optimization parameter, where the third optimization parameter indicates a minimum row weight value of row vectors corresponding to any plurality of high-reliability bit positions;

determining a third bit position set and a fourth bit position set from the first bit position set based on the third optimization parameter, where a row weight corresponding to a bit position in the third bit position set is m1 times greater than the third optimization parameter, m1 is a positive integer greater than or equal to 1, a row weight corresponding to a bit position in the fourth bit position set is m2 times greater than the third optimization parameter, m2 is a positive integer greater than or equal to 1, and m1 is not equal to m2; and determining, from the third bit position set, the bit positions that meet the first optimization parameter; or determining, from the fourth bit position set, the bit positions that meet the first optimization parameter; or determining, from the third bit position set and the fourth bit position set, the bit positions that meet the first optimization parameter.

In a possible design, the determining, from the third bit position set and the fourth bit position set, the bit positions that meet the first optimization parameter includes:

obtaining a fourth optimization parameter and a fifth optimization parameter, where the fourth optimization parameter indicates a quantity of bit positions in the third bit position set that are configured as check bit positions, and the fifth optimization parameter indicates a quantity of bit positions in the fourth bit position set that are configured as check bit positions; and determining, from the third bit position set, bit positions that meet the fourth optimization parameter, and determining, from the fourth bit position set, bit positions that meet the fifth optimization parameter, where a sum of the fourth optimization parameter and the fifth optimization parameter meets the first optimization parameter.

In a possible design, the determining, from the first bit position set, bit positions that meet the first optimization parameter, determining, from the second bit position set, bit positions that meet the second optimization parameter, and using the determined bit positions as the check bit positions includes:

determining, from the first bit position set in descending order of reliability, the bit positions that meet the first optimization parameter, determining, from the second bit position set in ascending order of reliability, the bit positions that meet the second optimization parameter, and using the determined bit positions as the check bit positions.

In a possible design, the obtaining the first optimization parameter includes:

obtaining the first optimization parameter based on a rounding function, a piecewise function, or a pre-stored correspondence that is met by the first optimization parameter and one or any combination of a length of the to-be-encoded information bits, a length of a bit sequence obtained after the coding, and a mother code length.

In a possible design, the obtaining the fourth optimization parameter includes:

obtaining the fourth optimization parameter based on a rounding function, a piecewise function, or a pre-stored correspondence that is met by the fourth optimization parameter and one or any combination of the length of the to-be-encoded information bits, the length of the bit sequence obtained after the coding, the first optimization parameter, the third optimization parameter, and a sixth optimization parameter, where the sixth optimization parameter indicates a quantity of bit positions that are in the first bit position set or the second bit position set and whose row weights meet the third optimization parameter.

In a possible design, the obtaining the fifth optimization parameter includes:

obtaining the fifth optimization parameter based on a rounding function, a piecewise function, or a pre-stored correspondence that is met by the fifth optimization parameter and one or any combination of the length of the to-be-encoded information bits, the length of the bit sequence obtained after the coding, the first optimization parameter, the third optimization parameter, and the sixth optimization parameter, where the sixth optimization parameter indicates the quantity of bit positions that are in the first bit position set or the second bit position combination and whose row weights meet the third optimization parameter.

In a possible design, the performing polar encoding or polar decoding based on the information bit positions and the check bit positions includes:

determining a check equation based on the check bit positions and the information bit positions, where if the check equation is obtained by sequentially arranging at least two elements, a last element indicates a check bit position, remaining elements indicate information bit positions checked by using the check bit positions, a sequence number difference between the check bit position and any one of the checked information bit positions is an integral multiple of a specified constant, and the specified constant has one or more values; and performing polar encoding or polar decoding based on the check equation.

In a possible design, the method further includes: storing one or any combination of Set 1 to Set 243, and querying the stored Set 1 to Set 243 based on the length of the to-be-encoded information bits and the length of the bit sequence obtained after the coding, to obtain the check bit positions and the information bit positions.

According to a second aspect, embodiments of this application provides a polar encoding/decoding apparatus, including:

a position determining unit, configured to determine information bit positions of to-be-encoded information bits, and determine check bit positions of check bits to be inserted into the information bits, where the check bit positions and the information bit positions are determined in reliability order and/or in row weight order, the reliability is reliability of polar channels on which the bit positions are located, and the row weights are row weights of row vectors in a polar code generator matrix that are corresponding to the polar channels; and an encoding/decoding unit, further configured to perform polar encoding or polar decoding based on the information bit positions and the check bit positions.

In a possible design, the check bit positions and the information bit positions meet any one of Set 1 to Set 243, and any one of Set 1 to Set 243 includes a plurality of check equations. If the check equation is obtained by sequentially arranging at least two elements, a last element indicates a check bit position, and remaining elements indicate information bit positions.

In a possible design, the position determining unit is specifically configured to:

determine a plurality of bit positions based on the reliability and/or the row weights, and determine the check bit positions and the information bit positions from the plurality of bit positions, where the plurality of bit positions are determined from most reliable bit positions in descending order of the reliability of the polar channels; or the plurality of bit positions are determined in row weight order of the generator matrix from bit positions corresponding to row vectors whose row weights meet an integral multiple of a minimum row weight; or some of the plurality of bit positions are determined from most reliable bit positions in descending order of the reliability of the polar channels, and the rest of the plurality of bit positions are determined in row weight order of the generator matrix from bit positions corresponding to row vectors whose row weights meet an integral multiple of a minimum row weight.

In a possible design, the position determining unit is specifically configured to:

the plurality of positions are in a first bit position set and a second bit position set, both the first bit position set and the second bit position set are determined from the most reliable bit positions in descending order of the reliability of the polar channels, and the first bit position set includes the bit positions corresponding to the row vectors whose row weights meet the integral multiple of the minimum row weight;

obtain a first optimization parameter and a second optimization parameter, where the first optimization parameter indicates a quantity of bit positions in the first bit position set that are configured as check bit positions, the second optimization parameter indicates a quantity of bit positions in the second bit position set that are configured as check bit positions, and a sum of the first optimization parameter and the second optimization parameter is equal to a total quantity of check bits inserted into the information bits;

determine, from the first bit position set, bit positions that meet the first optimization parameter, determine, from the second bit position set, bit positions that meet the second optimization parameter, and use the determined bit positions as the check bit positions; and determine the information bit positions from bit positions in the first bit position set or the second bit position set that are not determined as the check bit positions.

In a possible design, the position determining unit is specifically configured to:

obtain a third optimization parameter, where the third optimization parameter indicates a minimum row weight value corresponding to a plurality of high-reliability bit positions;

determine a third bit position set and a fourth bit position set from the first bit position set based on the third optimization parameter, where a row weight corresponding to a bit position in the third bit position set is m1 times greater than the third optimization parameter, m1 is a positive integer greater than or equal to 1, a row weight corresponding to a bit position in the fourth bit position set is m2 times greater than the third optimization parameter, m2 is a positive integer greater than or equal to 1, and m1 is not equal to m2; and determine, from the third bit position set, the bit positions that meet the first optimization parameter; or determine, from the fourth bit position set, the bit positions that meet the first optimization parameter; or determine, from the third bit position set and the fourth bit position set, the bit positions that meet the first optimization parameter.

In a possible design, the position determining unit is specifically configured to:

obtain the fourth optimization parameter and the fifth optimization parameter, where the fourth optimization parameter indicates a quantity of bit positions in the third bit position set that are configured as check bit positions, and the fifth optimization parameter indicates a quantity of bit positions in the fourth bit position set that are configured as check bit positions; and determine, from the third bit position set, bit positions that meet the fourth optimization parameter, and determine, from the fourth bit position set, bit positions that meet the fifth optimization parameter, where a sum of the fourth optimization parameter and the fifth optimization parameter meets the first optimization parameter.

In a possible design, the position determining unit is specifically configured to:

determine, from the first bit position set in descending order of reliability, the bit positions that meet the first optimization parameter, determine, from the second bit position set in ascending order of reliability, the bit positions that meet the second optimization parameter, and use the determined bit positions as the check bit positions.

In a possible design, the position determining unit is specifically configured to:

obtain the first optimization parameter based on a rounding function, a piecewise function, or a pre-stored correspondence that is met by the first optimization parameter and one or any combination of a length of the to-be-encoded information bits, a length of a bit sequence obtained after the coding, and a mother code length.

In a possible design, the position determining unit is specifically configured to:

obtain the fourth optimization parameter based on a rounding function, a piecewise function, or a pre-stored correspondence that is met by the fourth optimization parameter and one or any combination of the length of the to-be-encoded information bits, the length of the bit sequence obtained after the coding, the first optimization parameter, the third optimization parameter, and a sixth optimization parameter, where the sixth optimization parameter indicates a quantity of bit positions that are in the first bit position set or the second bit position combination and whose row weights meet the third optimization parameter.

In a possible design, the position determining unit is specifically configured to:

obtain the fifth optimization parameter based on a rounding function, a piecewise function, or a pre-stored correspondence that is met by the fifth optimization parameter and one or any combination of the length of the to-be-encoded information bits, the length of the bit sequence obtained after the coding, the first optimization parameter, the third optimization parameter, and the sixth optimization parameter, where the sixth optimization parameter indicates the quantity of bit positions that are in the first bit position set or the second bit position combination and whose row weights meet the third optimization parameter.

In a possible design, the encoding/decoding unit is specifically configured to:

determine a check equation based on the check bit positions and the information bit positions, where if the check equation is obtained by sequentially arranging at least two elements, a last element indicates a check bit position, remaining elements indicate information bit positions checked by using the check bit positions, a value of the element indicates a sequence number of a corresponding check bit position or information bit position, and a sequence number difference between the check bit position and any one of the checked information bit positions is an integral multiple of a specified constant; and perform polar encoding or polar decoding based on the check equation.

In a possible design, the apparatus further includes a storage unit, where the storage unit is specifically configured to store one or any combination of Set 1 to Set 243; and the position determining unit is specifically configured to query the stored Set 1 to Set 243 based on the length of the to-be-encoded information bits and the length of the bit sequence obtained after the coding, to obtain the check bit positions and the information bit positions.

According to a third aspect, a polar encoding apparatus is provided, where the polar encoding apparatus has a function of implementing transmit end behavior in the first aspect or any possible implementation of the first aspect. The function may be implemented by hardware, or may be implemented by executing corresponding software by hardware. The hardware or the software includes one or more modules corresponding to the function.

According to a fourth aspect, a polar encoding apparatus is provided, where the polar encoding apparatus includes a transceiver, a processor, and a memory, the processor and the memory are connected by using a bus system, the processor is configured to execute code in the memory, and when the code is executed, the processor performs the method in the first aspect or any possible implementation of the first aspect.

According to a fifth aspect, a polar decoding apparatus is provided, where the polar decoding apparatus has a function of implementing receive end behavior in the first aspect or any possible implementation of the first aspect. The function may be implemented by hardware, or may be implemented by executing corresponding software by hardware. The hardware or the software includes one or more modules corresponding to the function.

According to a sixth aspect, a polar decoding apparatus is provided, where the polar decoding apparatus includes a transceiver, a processor, and a memory, the processor and the memory are connected by using a bus system, the processor is configured to execute code in the memory, and when the code is executed, the processor performs the method in the first aspect or any possible implementation of the first aspect.

According to a seventh aspect, a system chip is provided, where the system chip includes a processor and a memory, the processor and the memory are connected by using a bus system, the processor is configured to execute code in the memory, and when the code is executed, the processor performs the method in the first aspect or any possible implementation of the first aspect.

According to an eighth aspect, a computer-readable storage medium is provided, where the computer-readable storage medium stores an instruction, and when the instruction is run on a computer, the computer performs the method in the foregoing aspects.

According to a ninth aspect, embodiments of another aspect of this application provides a computer program product that includes an instruction, and when the instruction is run on a computer, the computer performs the method in the foregoing aspects.

DETAILED DESCRIPTION OF EMBODIMENTS

The following further describes embodiments of this application in details with reference to the accompanying drawings.

According to a polar encoding/decoding (collectively referred to as coding) method provided in embodiments of this application, K information bits, with K between 12 and 22, are arranged in an information bit sequence. One or more check bits are inserted into the information bit sequence according to a policy of selecting check bit positions. The positions of the check bits in the information bit sequence are set in reliability order or in row weight order. The embodiments of this application are applicable to control channel coding in 5G NR, and may be applicable to various other scenarios in 5G NR, in which a quantity of to-be-encoded information bits is between 12 bits and 22 bits. Potentially, the application scenarios of the embodiments of the present application may include all scenarios in 5G NR, in which a quantity of information bits is relatively small, such as uplink control channel coding and downlink control channel coding.

Figure 1:
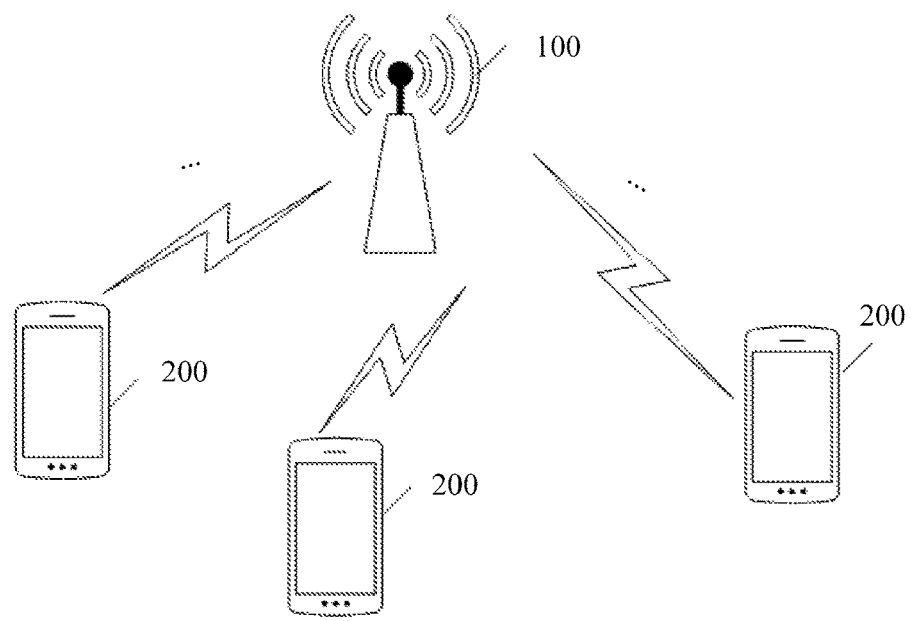
FIG. 1 is a schematic diagram of a communication system.

FIG. 1 is a schematic diagram of a communications system. The communications system includes one or more network devices (only one network device 100 is shown) and one or more terminal devices 200 connected to the network device 100.

The network device 100 may be a device that can communicate with the terminal device 200. The network device 100 may be any device having a wireless sending/receiving function. The network device 100 includes but is not limited to a base station (for example, a NodeB, an evolved NodeB (eNodeB), a base station in a 5G communications system, a base station or a network device in a future communications system, an access node, a wireless relay node, a wireless backhaul node in a WiFi system, and the like). The network device 100 may also be a radio controller in a cloud radio access network (CRAN) scenario. The network device 100 may further be a small cell, a transmission node such as transmission reference point (TRP), or the like. Certainly, this application is not limited thereto.

The terminal device 200 is a device having a wireless sending/receiving function. The terminal device 200 may be deployed on land and includes an indoor or outdoor device, a hand-held device, a wearable device, or an in-vehicle device. Alternatively, the terminal device 200 may be deployed on a water surface (for example, on a ship), or may be deployed in the air (for example, in an airplane, a balloon, or a satellite). The terminal device may be a mobile phone, a tablet computer, a personal computer, a virtual reality (VR) terminal, an augmented reality (AR) terminal, a wireless terminal in industrial control, a wireless terminal in self driving, a wireless terminal in remote medical, a wireless terminal in a smart grid, a wireless terminal in transportation safety, a wireless terminal in a smart city application, a wireless terminal in a smart home, and the like. Application scenarios of the terminal device are not limited by the embodiments of this application. A terminal device may be referred to by other terminology such as a user equipment (UE) device, an access terminal device, a mobile station, a remote station, a remote terminal device, a mobile device, a wireless communications device, or the like.

It should be noted that the terms "system" and "network" may be used interchangeably in this application. The term "a plurality of" means "at least two". The term "and/or" describes an association relationship between associated objects and indicates that three relationships may exist. For example, A and/or B may indicate the following three cases: only A exists, both A and B exist, and only B exists. In addition, the character "/" usually indicates an "or" relationship between the associated objects, unless otherwise specified.

For ease of understanding, a polar encoding process is described below.

The polar code encoding method is characterized by high performance, low complexity, and a flexible rate matching manner. The encoding process may be represented by the following formula:

$$x = u \times F_n,$$

where $u = (u_1, u_2, \ldots, u_n)$ is a binary vector with a length of n bits, $F_n$ is a generator matrix, $$F_n = \begin{bmatrix} 1 & 0 \\ 1 & 1 \end{bmatrix}^{\otimes n},$$

a Kronecker product of n 2×2 matrices $F_2$, $$F_2 = \begin{bmatrix} 1 & 0 \\ 1 & 1 \end{bmatrix},$$

and x is an encoded vector. In the following, the generator matrix $F_n$ is also denoted as G.

Figure 2:
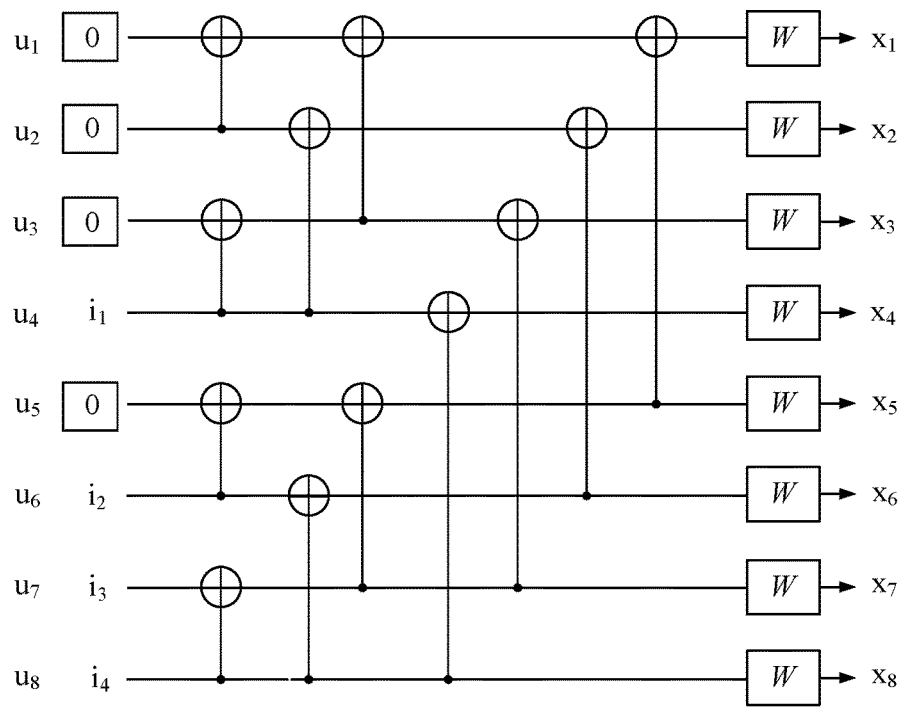
FIG. 2 is a schematic diagram of a first type of polar coding in the prior art.

FIG. 2 shows an 8×8 coding matrix (N=8). A vector u is represented by $(0, 0, 0, u_4, 0, u_6, u_7, u_8)$. After the vector u is encoded by using the coding matrix, the encoded bits are represented by a vector $x(x_1, x_2, x_3, x_4, x_5, x_6, x_7, x_8)$ (also called a codeword). Polarization occurs when the polar code is used for encoding and a bit successive-cancellation (SC) method is used for decoding. Polarization means that some bits of the vector u pass through corresponding high-reliability channels and have a higher probability of being decoded correctly, and other bits pass through corresponding low-reliability channels and have a lower probability of being decoded correctly. Normally, the high-reliability channels are used for transmitting information bits, and the low-reliability channels are used for transmitting frozen bits, i.e. bits with a fixed value (for example, set to 0). This means that, the low-reliability channels are not used for transmitting data. As shown in FIG. 2, in the vector u, bit positions $\{u_1, u_2, u_3, u_5\}$ are set as frozen bit positions, bit positions $\{u_4, u_6, u_7, u_8\}$ are set as information bit positions. An encoded vector x with eight coded bits $\{x_1, x_2, \ldots, x_8\}$ is generated by encoding an information vector $\{i_1, i_2, i_3, i_4\}$ whose bit positions in the vector u are $\{u_4, u_6, u_7, u_8\}$ respectively. After the encoding, the encoded bits are output after being modulated and then passing through a noise channel.

Figure 3:
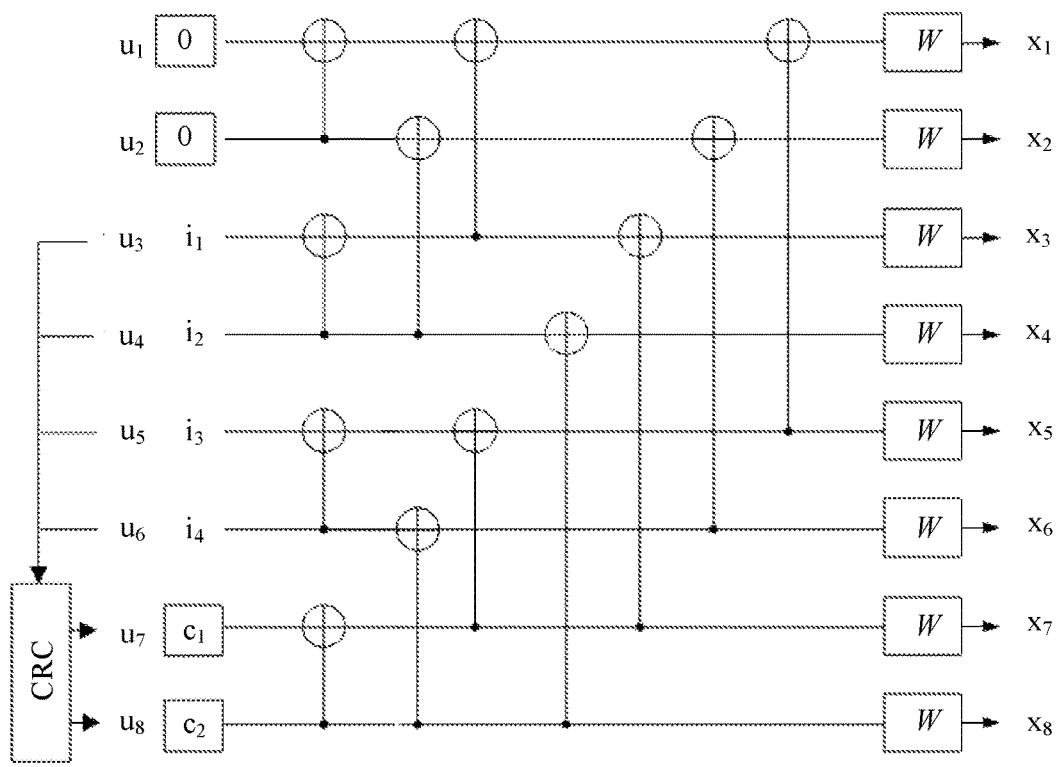
FIG. 3 is a schematic diagram of a second type of polar coding in the prior art.
Figure 4:
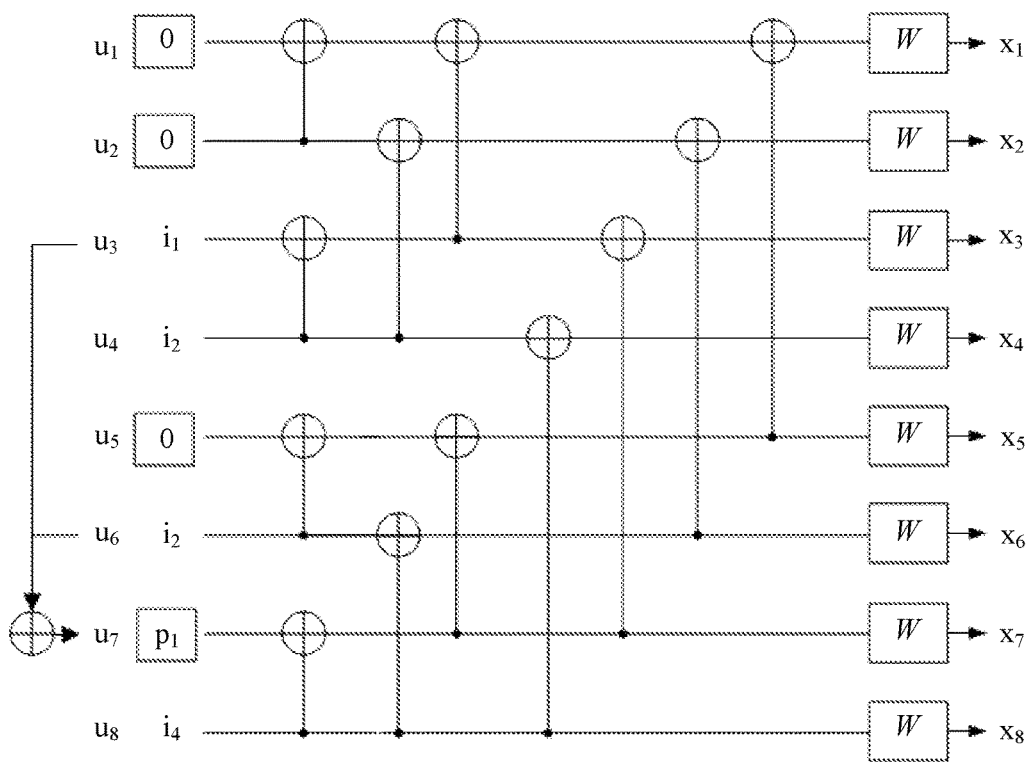
FIG. 4 is a schematic diagram of a polar coding scheme according to an embodiment of this application.

To improve polar code performance, a check precoding is usually performed first on the information bits before the polar coding. There are two common polar coding manners with check precoding: (1) a cyclic redundancy check (CRC)-concatenated polar coding as shown in FIG. 3, and (2) a parity check (PC)-concatenated polar coding as shown in FIG. 4. Compared with the conventional polar coding as shown in FIG. 2, and CRC-concatenated polar code as shown in FIG. 3, the PC-concatenated polar (PC-polar) code shown in FIG. 4 has better performance in terms of code distance and block error rate (BLER) when using a successive cancellation list (SCL) algorithm for decoding. For the PC-polar code, a check precoding is performed on the information bits before polar coding is performed. In the check precoding, a check equation needs to be generated. A last element in the check equation indicates a check bit position, and other elements indicate information bit positions. The check bit position is used for error correction during decoding at a receive end, to improve the probability of successfully decoding at the information bit positions. In the check equation, a value of the check bit position is obtained by performing addition modulo 2 calculation on values of the information bit positions. For example, if a check equation is [3, 6, 7], a third sub-channel (bit position) and a sixth sub-channel (bit position) are information sub-channels (bit positions). If values of the information sub-channels are $u_3$ and $u_6$, respectively, a value $u_7$ of the check bit position is equal to $\mod(u_3 + u_6, 2)$.

In the parity check polar code as shown in FIG. 4, a check bit position and information bit positions are determined in the following manner: The check bit position is randomly set, and then K information bit positions are first selected in an information bit position selection manner in the conventional polar code. The K bit positions may be sequentially selected as the information bit positions in descending order of reliability. In this case, check capability of the check bit position cannot be ensured, and overall polar performance may be affected.

In the polar code, dimensions of the coding matrix $F_n$ is n×n and n is an integral power of 2. Therefore, a natural length of a polar code codeword generated by the foregoing polar coding formula is also an integral power of 2. However, in different communication systems, depending on the system design, the length of the codeword may need to be set to any integer. In this case, a rate matching needs to be performed on a coded vector, to change the code length any length. The coded vector before the rate matching is referred to as a mother code vector. For ease of representation, assuming that a length of the mother code vector is $M_0$, a length of a coded vector obtained after the rate matching is set to M. $M_0$ is an integral power of 2, and M may be any integer.

Specifically, the manners for polar code rate matching include: repetition, puncturing, and shortening, and further a combination of any two or three of the foregoing three manners. For example, the repetition manner is as follows: If $M_0<M$, a mother code whose length is $M_0$ is repeated until the code length M is reached. The puncturing manner and the shortening manner are as follows: If $M_0>M$, a coded bit at a particular bit position of the mother code is not sent, to achieve rate matching.

A difference between the puncturing manner and the shortening manner is that in the puncturing manner, a log likelihood ratio (LLR) value of an unsent bit position of mother code is set to 0 by a decoder, and this means that a value of the unsent bit position is unknown. In the shortening manner, an LLR of an unsent bit position of mother code is set to positive infinity or negative infinity by a decoder, and this means that a value of the unsent bit position is fully known.

The shortening manner can be described by using the following example. For the following generator matrix whose mother code length is 4, it is assumed that a first sub-channel (bit position) and a fourth sub-channel (bit position) are frozen sub-channels (bit positions), and a second sub-channel (bit position) and a third sub-channel (bit position) are information sub-channels (bit positions). It may be found that for any information bit combination, a fourth bit of a mother code codeword is 0. In this case, a known value does not need to be sent on a channel. On the decoder, if an LLR corresponding to 0 is positive, a received LLR of the fourth bit of the mother code codeword is set to positive infinity. Therefore, a polar code, of a non-mother-code length, for which K=2 and N=3 is obtained.

$$G_{polar}(3,2) = \begin{bmatrix} 1 & 00 & 0 \\ 1 & 10 & 0 \\ 1 & 01 & 0 \\ 1 & 11 & 1 \end{bmatrix}$$

The PC-polar code may be uniquely determined based on frozen bit position(s), check bit position(s), check equation, information bit positions, rate matching manner, and puncturing/shortening position(s). These determining factors are referred to as construction parameters of the PC-polar code.

In the polar code, a row weight is defined as follows: In an example of a 2×2 polar code, row weights of a first row to a fourth row of a generator matrix G of the 2×2 polar code, as shown below, are 1, 2, 2, and 4, respectively. To be specific, weight of a row equals to quantities of is in the rows.

$$G = \begin{bmatrix} 1 & 00 & 0 \\ 1 & 10 & 0 \\ 1 & 01 & 0 \\ 1 & 11 & 1 \end{bmatrix}$$

In the polar code, a reliability of a sub-channel (bit position) of a polar codeword may be obtained through Gaussian approximation, may be calculated by using a formula, or may be obtained from a pre-stored reliability sequence.

Based on the foregoing descriptions, the encoding/decoding method provided in the embodiments of this application is specifically described below with reference to the accompanying drawings.

In the following descriptions, bit positions are represented by using row indexes 0, 1, . . . , and $M_{0-1}$ of a generator matrix. Optionally, bit positions may be represented by using row indexes 1, 2, . . . , and $M_0$ of a generator matrix. Optionally, bit positions may be represented by using column indexes of a generator matrix. In the embodiments of this application, bit positions are represented by using row indexes starting from 1. $M_0$ is a mother code length of a PC-polar codeword, and K is a quantity of to-be-encoded information bits. If there are CRC bits, all or some of the CRC bits may be included in the K information bits, or the CRC bits may not be included in the K information bits. M is a length of a bit sequence obtained after the coding. $M_0$, K, and M are each a positive integer. R is a rate matching manner. P is a set of one or more processing positions for the rate matching manner, for example, a puncturing or shortening position. F/PF (frozen/parity function) is also a set including one or more check functions, and the check function set includes one or more elements. A PC-polar codeword may be uniquely determined based on a combination {K, M, P, F/PF} including these construction parameters: K, M, P, and F/PF.

Figure 5A:
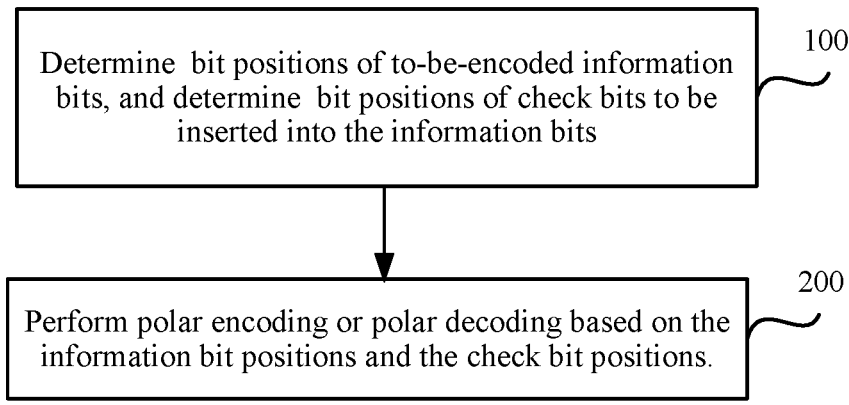
FIG. 5A is a flowchart of a flowchart of a polar encoding/decoding method according to an embodiment of this application.

A polar encoding/decoding method provided in this application is described below with reference to a specific embodiment. The polar encoding/decoding method is applicable to polar encoding at a communication device that transmits information (referred to as transmit end hereinafter), and is also applicable to polar decoding at a communication device that receives information (referred to as receive end hereinafter). As shown in FIG. 5A, the method includes the following steps.

Step 100: Determine bit positions of to-be-encoded information bits, and determine bit positions of check bits to be inserted into the information bits, where the bit positions of the check bits and the bit positions of the information bits are determined according to a reliability sorting principle and/or a row weight sorting principle.

Optionally, the check bit positions and the information bit positions are determined from most reliable bit positions in descending order of reliability. Alternatively, the check bit positions and the information bit positions are determined in row weight order from bit positions whose row weights are integral multiples of a minimum row weight. Alternatively, the check bit positions and the information bit positions are determined by selecting, from most reliable bit positions in descending order of reliability and in row weight order, bit positions whose row weights are integral multiples of a minimum row weight. The information bits at the information bit positions are used to generate the check bits to be inserted at the check bit positions.

Step 200: Perform polar encoding or polar decoding based on the information bit positions and the check bit positions.

For step 100, two optional implementation solutions are provided.

In a solution 1, the check bit positions and the information bit positions meet any one of stored Set 1 to Set 243 (details are provided below). Any one of Set 1 to Set 243 includes a plurality of check equations. If the check equation is obtained by sequentially arranging at least two elements, a last element indicates a check bit position, remaining elements indicate information bit positions, and an element value indicates a sequence number of a corresponding check bit position or information bit position.

In this case, step 100 specifically includes: first storing one or any combination of Set 1 to Set 243, obtaining a length of the to-be-encoded information bits and a length of a bit sequence obtained after the coding, and querying the stored Set 1 to Set 243 based on the length of the to-be-encoded information bits and the length of the bit sequence obtained after the coding, to obtain the check bit positions and the information bit positions.

One or any combination of Set 1 to Set 243 is stored by using K and M as index items. During the querying, for example, K=12 and M=48, Set 1 may be obtained based on K=12 and M=48; and based on check equations [53, 58], [30, 45, 55, 60], [31, 46, 51, 61], and [47, 57, 62] in Set 1, it may be found that 58, 60, 61, and 62 are sequence numbers corresponding to check bit positions, and 53, 30, 45, 55, 31, 46, 51, 47, and 57 are sequence numbers corresponding to information bit positions checked by using the corresponding check bit positions.

In a solution 2, a plurality of bit positions are determined based on reliability and/or row weights, and the check bit positions and the information bit positions are determined from the plurality of bit positions.

The plurality of bit positions are determined from most reliable bit positions in descending order of reliability of the polar channels; or the plurality of bit positions are determined in row weight order of the generator matrix from bit positions corresponding to row vectors whose row weights meet an integral multiple of a minimum row weight; or some of the plurality of bit positions are determined from most reliable bit positions in descending order of reliability of the polar channels, and the rest of the plurality of bit positions are determined in row weight order of the generator matrix from bit positions corresponding to row vectors whose row weights meet an integral multiple of a minimum row weight.

Optionally, the determining the check bit positions and the information bit positions from the plurality of bit positions includes:

the plurality of positions are in a first bit position set and a second bit position set, both the first bit position set and the second bit position set are determined from the most reliable bit positions in descending order of the reliability of the polar channels, and the first bit position set includes the bit positions corresponding to the row vectors whose row weights meet the integral multiple of the minimum row weight;

obtaining a first optimization parameter and a second optimization parameter, where the first optimization parameter indicates a quantity of bit positions in the first bit position set that are configured as check bit positions, the second optimization parameter indicates a quantity of bit positions in the second bit position set that are configured as check bit positions, and a sum of the first optimization parameter and the second optimization parameter is equal to a total quantity of check bits inserted into the information bits;

determining, from the first bit position set, bit positions that meet the first optimization parameter, determining, from the second bit position set, bit positions that meet the second optimization parameter, and using the determined bit positions as the check bit positions; and determining the information bit positions from bit positions in the first bit position set or the second bit position set that are not determined as the check bit positions.

Optionally, the determining the check bit positions and the information bit positions from the plurality of bit positions includes:

the plurality of positions are in a first bit position set, the first bit position set is determined from the most reliable bit positions in descending order of the reliability of the polar channels, and the first bit position set includes the bit positions corresponding to the row vectors whose row weights meet the integral multiple of the minimum row weight; obtaining a first optimization parameter, where the first optimization parameter indicates a quantity of bit positions in the first bit position set that are configured as check bit positions, and the first optimization parameter is equal to a total quantity of check bits inserted into the information bits; determining, from the first bit position set, bit positions that meet the first optimization parameter as the check bit positions; and determining the information bit positions from bit positions in the first bit position set that are not determined as the check bit positions.

Optionally, the determining the check bit positions and the information bit positions from the plurality of bit positions includes:

the plurality of positions are in a second bit position set, and the second bit position set is determined from the most reliable bit positions in descending order of the reliability of the polar channels; obtaining a second optimization parameter, where the second optimization parameter indicates a quantity of bit positions in the second bit position set that are configured as check bit positions, and the second optimization parameter is equal to a total quantity of check bits inserted into the information bits; determining, from the second bit position set, bit positions that meet the second optimization parameter as the check bit positions; and determining the information bit positions from bit positions in the second bit position set that are not determined as the check bit positions.

Figure 5B:
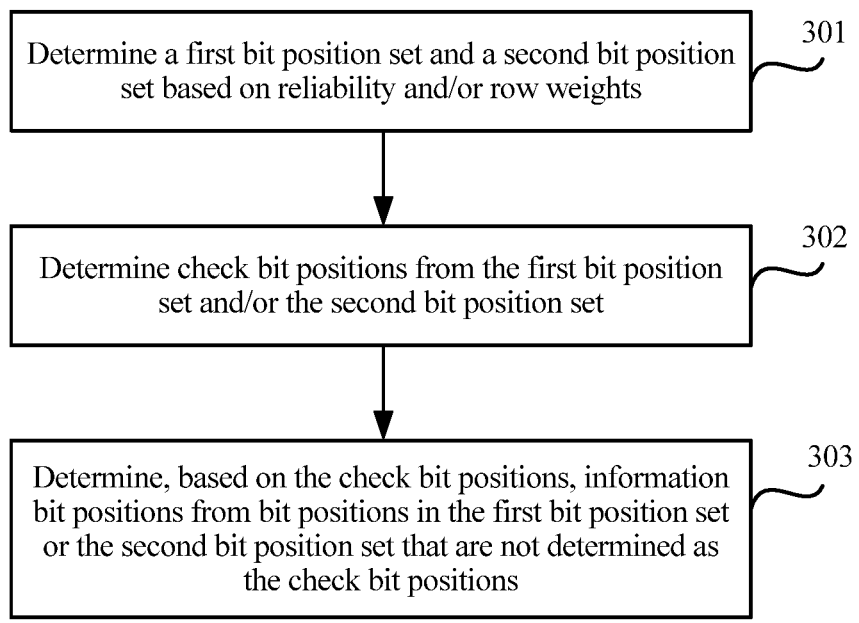
FIG. 5B is a flowchart of a polar encoding/decoding method according to an embodiment of this application.

Optionally, this application provides a check bit position determining method. As shown in FIG. 5B, the method includes the following steps.

Step 301: Determine a first bit position set and a second bit position set based on reliability and/or row weights.

A reliability order is an order of reliability of bit positions. The bit position is also referred to as a sub-channel of polar code. Reliability of the sub-channel (bit position) of the polar code may be obtained through Gaussian approximation, may be calculated by using a formula, or may be obtained by pre-storing a reliability sequence. A sequence number of the bit position is represented by using a row number of a generator matrix. Sequence numbers may start from 0 or may start from 1.

Optionally, the first bit position set and the second bit position set are determined from most reliable bit positions in descending order of reliability.

Optionally, the first bit position set and the second bit position set are determined in row weight order from bit positions whose row weights are integral multiples of a minimum row weight.

Optionally, the first bit position set and the second bit position set are determined by selecting, from most reliable bit positions in descending order of reliability and in row weight order, bit positions whose row weights are integral multiples of a minimum row weight.

If a quantity of bit positions in the first bit position set is a first preset value, and a quantity of bit positions in the second bit position set is a second preset value, the first preset value is different from the second preset value. The first preset value is less than the second preset value, or the first preset value is greater than or equal to the second preset value. The first preset value and the second preset value need to be set and determined according to a principle that bit positions can be allocated to to-be-encoded information bits and check bits to be inserted into the to-be-encoded information bits.

Optionally, the first preset value may be determined based on K and M. For example, a first optimization parameter F is determined based on K and M, and the first preset value is determined as K+F based on F. The first optimization parameter F indicates a quantity of bit positions in the first bit position set that are configured as check bit positions. If J' indicates a quantity of check bits to be inserted into K to-be-encoded information bits, a value of F ranges from 0 to J', or a value of F may be 0 or J'.

Optionally, the first preset value may be determined based on K and J'. For example, the first preset value is K+J'.

Optionally, the first preset value is less than or equal to the second preset value. Optionally, the first preset value is K+F, and the second preset value is K+J'.

Step 302: Determine check bit positions from the first bit position set and/or the second bit position set.

In this application, the check bit positions may be determined from the first bit position set, may be determined from the second bit position set, or may be determined from the first bit position set and the second bit position set.

In this application, a quantity of bit positions that are selected from the first bit position set as check bit positions and a quantity of bit positions that are selected from the second bit position set as check bit positions may be configured. The check bit positions are determined based on the configurations that are corresponding to the first bit position set and the second bit position set, respectively.

An optional configuration is as follows: The first optimization parameter indicates the quantity of bit positions in the first bit position set that are configured as check bit positions, a second optimization parameter indicates the quantity of bit positions in the second bit position set that are configured as check bit positions, and a sum of the first optimization parameter and the second optimization parameter is equal to a total quantity of check bits inserted into the information bits.

Optionally, if the first bit position set is a set of a plurality of bit positions that are selected from the most reliable bit positions and whose row weights are integral multiples of the minimum row weight, the first optimization parameter indicates a quantity of bit positions in the first bit position set that are configured as check bit positions and whose row weights are integral multiples of the minimum row weight.

Optionally, if the second bit position set is a set of a plurality of bit positions that are selected from the most reliable bit positions and whose row weights are integral multiples of the minimum row weight, the second optimization parameter indicates a quantity of bit positions in the second bit position set that are configured as check bit positions and whose row weights are integral multiples of the minimum row weight.

For example, if the first optimization parameter is represented by F, the second optimization parameter is represented by E, and the quantity of check bits to be inserted into the K to-be-encoded information bits is represented by J', E+F=J'. J' is also a check bit quantity limit. A value of E ranges from 0 to J', or a value of E may be 0 or J'.

Based on the foregoing configurations, the check bit positions may be determined in the following three manners:

In a manner 1, the first optimization parameter is obtained, and bit positions that meet the first optimization parameter are determined from the first bit position set as the check bit positions.

In the manner 1, if all the check bit positions are determined from the first bit position set, J' bit positions are determined from the first bit position set as the check bit positions. In this case, the first optimization parameter F=J', and E=0.

In a manner 2, the second optimization parameter is obtained, and bit positions that meet the second optimization parameter are determined from the second bit position set as the check bit positions.

In the manner 2, if all the check bit positions are determined from the second bit set, J' bit positions are determined from the second bit position set as the check bit positions. In this case, the second optimization parameter E=J', and F=0.

In a manner 3, the first optimization parameter and the second optimization parameter are obtained, bit positions that meet the first optimization parameter are determined from the first bit position set, bit positions that meet the second optimization parameter are determined from the second bit position set, and the bit positions determined from the first bit position set and the second bit position set are used as the check bit positions.

In the manner 3, when the check bit positions are determined from the first bit position set and the second bit position set, the first optimization parameter meets $0<F<J'$, the second optimization parameter meets $0<E<J'$, and a sum of E and F is equal to J'.

In any one of the foregoing three manners, bit positions may be determined in descending order of reliability or in ascending order of reliability from the first bit position set and/or the second bit position set as the check bit positions.

Optionally, when the bit positions are determined from the first bit position set and the second bit position set as the check bit positions, the bit positions are determined from the first bit position set in descending order of reliability, the bit positions are determined from the second bit position set in ascending order of reliability, and the determined bit positions are used as the check bit positions.

Step 303: Determine, based on the check bit positions, information bit positions from bit positions in the first bit position set or the second bit position set that are not determined as the check bit positions.

If the J' check bit positions are determined from the first bit position set in the manner 1, K bit positions may be determined from the second bit position set as the information bit positions, or K bit positions are still determined from the first bit position set as the information bit positions.

If the J' check bit positions are determined from the second bit position set in the manner 2, K bit positions are determined from the first bit position set as the information bit positions, or K bit positions are still determined from the second bit position set as the information bit positions.

If the J' check bit positions are determined from the first bit position set and the second bit position set in the manner 3, K bit positions are still determined from remaining bit positions in the first bit position set or the second bit position set as the information bit positions.

Optionally, the information bit positions are selected from the first bit position set or the second bit position set in descending order of reliability or in ascending order of reliability.

Based on any one of the foregoing embodiments, in this application, bit positions may be selected in row weight order from the first bit position set and/or the second bit position set as the check bit positions or the information bit positions, to obtain PC-polar code with better performance.

For ease of description, for example, the bit positions that meet the first optimization parameter are determined in row weight order from the first bit position set as the check bit positions.

Specifically, that the check bit positions are determined according to a row weight sorting principle may be implemented by configuring a third optimization parameter. The third optimization parameter indicates a minimum row weight value corresponding to a plurality of high-reliability bit positions. When a bit position is represented by using a row number of a generator matrix, a row weight value corresponding to the bit position is a row weight value of a row vector corresponding to the row number.

The plurality of high-reliability bit positions are a plurality of highest-reliability bit positions sequentially obtained in descending order of reliability.

Optionally, the third optimization parameter indicates a minimum row weight value corresponding to K, K+F, K+J', or K+J high-reliability bit positions. J is a quantity of CRC bits that is equivalent to a false alarm rate (FAR) required by a system. For example, J=0 indicates that the system requires no FAR, and J=16 indicates that a false alarm rate required by the system is approximately $2^{-16}$.

Optionally, the minimum row weight value indicated by the third optimization parameter may be obtained by querying a set.

Optionally, the third optimization parameter may indicate a minimum row weight value corresponding to the bit positions in the second bit position set.

One or more subsets are further determined from the first bit position set based on the third optimization parameter.

Optionally, bit positions whose row weights meet the third optimization parameter are selected from the first bit set as a subset, or bit positions whose row weights are m1 times greater than the third optimization parameter are selected from the first bit set as a subset, where m1 is a positive integer greater than or equal to 1.

Further, a particular quantity of bit positions that meet a reliability requirement are selected from the one or more subsets as the check bit positions or the information bit positions. Optionally, the quantity of bit positions selected from the subsets may be configured.

Optionally, two subsets, a third bit position set and a fourth bit position set, are determined from the first bit position set. A row weight corresponding to a bit position in the third bit position set is m1 times greater than the third optimization parameter, and m1 is a positive integer greater than or equal to 1. A row weight corresponding to a bit position in the fourth bit position set is m2 times greater than the third optimization parameter, and m2 is a positive integer greater than or equal to 1.

For example, two subsets, a third bit position set and a fourth bit position set, are determined from the first bit position set. A row weight corresponding to a bit position in the third bit position set is one time greater than the third optimization parameter $w_{min}$. A row weight corresponding to a bit position in the fourth bit position set is twice greater than the third optimization parameter, namely, $2w_{min}$. The fourth optimization parameter $J_1'$ is configured, to indicate a quantity of bit positions in the third bit position set that are configured as check bit positions. The fifth optimization parameter $J_1'$ is configured, to indicate a quantity of bit positions in the fourth bit position set that are configured as check bit positions. In this scenario, the first optimization parameter F indicates a total quantity of bit positions that are in the third bit set and the fourth bit set and that are configured as check bit positions.

F bit positions are determined from the first bit position set as the check bit positions based on the third optimization parameter $w_{min}$, the fourth optimization parameter $J_1'$, and the fifth optimization parameter $J_2'$ by using the following steps:

First, $w_{min}$ is obtained.

Second, the third bit position set and the fourth bit position set are determined from the first bit position set based on $w_{min}$, where the row weight corresponding to the bit position in the third bit position set is $w_{min}$, and the row weight corresponding to the bit position in the fourth bit position set is $2w_{min}$.

Third, the fourth optimization parameter $J_1'$ and the fifth optimization parameter $J_2'$ are obtained, and the F bit positions are determined from the third bit position set and/or the fourth bit position set as the check bit positions.

Specifically, this step includes three optional selection manners.

In a selection manner 1, $J_1'$ is obtained, and $J_1'$ bit positions are determined from the third bit position set. In this case, $J_1'=F$.

In a selection manner 2, $J_2'$ is obtained, and $J_2'$ bit positions are determined from the fourth bit position set. In this case, $J_2'=F$.

In a selection manner 3, $J_1'$ and $J_2'$ are obtained, $J_1'$ bit positions are determined from the third bit position set, and $J_2'$ bit positions are determined from the fourth bit position set. $J_1'+J_2'=F$.

Based on any one of the foregoing embodiments of this application, the first optimization parameter F is determined in the following manner:

The first optimization parameter F is obtained based on a rounding function, a piecewise function, or a pre-stored correspondence that is met by the first optimization parameter F and one or any combination of a length K of the to-be-encoded information bits, a length M of a bit sequence obtained after the coding, and a mother code length $M_0$.

Optionally, a value of F is determined based on a rounding function that is met by F and a combination of any two of K, M, and $M_0$. If integer(x) indicates a rounding function, the rounding function that is met by F and a combination of any two of K, M, and $M_0$ is as follows:

F=integer(f(M−K));
F=integer(f($M_0$−K));
F=integer(f(K/M)); or
F=integer(f(K/$M_0$)).

Optionally, a value of F is determined based on a rounding function that is met by F and both K and M. If f(M,K) indicates a function related to K and M, a calculation formula of F is represented by the following piecewise function:

$$F = \begin{cases} C1, & \text{if } K < C3 \\ C2, & \text{if } K \geq C3 \end{cases}$$

$$F = \begin{cases} C1, & \text{if } f(M, K) < C3 \\ C2, & \text{if } f(M, K) \geq C3 \end{cases}$$

C1, C2, and C3 are any integers, and may be constants, functions related to a CRC bit length, or functions related to a required FAR. F may not be limited to being divided into two segments, and may be divided into a plurality of segments. F is a piecewise function. One segment per K is not precluded, and segments are corresponding to a same value or different values.

TABLE 1

| F | K = 12 | K = 13 | K = 14 | K = 15 | K = 16 | K = 17 | K = 18 | K = 19 | K = 20 | K = 21 | K = 22 |
|---|---|---|---|---|---|---|---|---|---|---|---|
| M = 48 | 4 | 4 | 4 | 4 | 3 | 3 | 3 | 3 | 3 | 3 | 3 |
| M = 64 | 4 | 4 | 4 | 4 | 4 | 4 | 4 | 4 | 4 | 4 | 3 |
| M = 96 | 4 | 4 | 4 | 4 | 4 | 4 | 4 | 4 | 4 | 4 | 4 |

TABLE 2

| F | K = 12 | K = 13 | K = 14 | K = 15 | K = 16 | K = 17 | K = 18 | K = 19 | K = 20 | K = 21 | K = 22 |
|---|---|---|---|---|---|---|---|---|---|---|---|
| M = 48 | 4 | 4 | 4 | 3 | 2 or 3 | 1 or 2 | 3 | 2 | 1 | 2 | 3 |
| M = 64 | 4 | 4 or 5 | 4 | 3 | 2 or 5 | 4 | 3 | 4 | 3 | 2 | 5 |
| M = 80 | 5 | 4 | 4 | 4 | 4 | 3 | 5 | 5 | 5 | 4 | 3 |
| M = 96 | 5 | 4 | 4 | 4 | 4 | 3 | 1 | 4 | 4 | 4 | 3 |

Optionally, for M=48, a calculation formula of F is indicated as follows:

$$F = \begin{cases} 4, & \text{if } K < 16 \\ 3, & \text{if } K \geq 16 \end{cases}$$

For M=64, a calculation formula of F is indicated as follows:

$$F = \begin{cases} 4, & \text{if } K < 22 \\ 3, & \text{if } K \geq 22 \end{cases}$$

Optionally, a calculation formula of F may be indicated as follows:

$$F = \begin{cases} 1, & \text{if } M - K > C4 \\ 0, & \text{if } M - K \leq C4 \end{cases}$$

All the F check bits may be distributed at bit positions whose row weights are equal to $w_{min}$, or may be distributed at bit positions whose row weights are equal to $2w_{min}$. C4 may be a constant, for example, 192, 33, 49, 30, or 46, may be a function related to a CRC bit length, or may be a function related to a required FAR.

Optionally, a calculation formula of F may be indicated as follows:

$$F = \begin{cases} 1, & \text{if } K < C5 \\ 0, & \text{if } K \geq C5 \end{cases}$$

All the F check bits may be distributed at bit positions whose row weights are equal to $w_{min}$, or may be distributed at bit positions whose row weights are equal to $2w_{min}$. C5 may be a constant, for example, 15, 16, 17, or 18, may be a function related to a CRC bit length, or may be a function related to a required FAR (false alarm rate).

Optionally, F may be determined based on a pre-stored correspondence that is met by F and both K and M. For example, for the correspondence met by F, K, and M, refer to Table 1 or Table 2.

Based on any one of the foregoing embodiments of this application, optionally, the fourth optimization parameter $J_1'$ is determined in the following manner:

The fourth optimization parameter is obtained based on a rounding function, a piecewise function, or a pre-stored correspondence that is met by the fourth optimization parameter and one or any combination of the length of the to-be-encoded information bits, the length of the bit sequence obtained after the coding, the first optimization parameter, the third optimization parameter, and a sixth optimization parameter. The sixth optimization parameter indicates a quantity of bit positions that are in the first bit position set or the second bit position combination and whose row weights meet the third optimization parameter.

Optionally, the fifth optimization parameter $J_2'$ is determined in the following manner:

The fifth optimization parameter is obtained based on a rounding function, a piecewise function, or a pre-stored correspondence that is met by the fifth optimization parameter and one or any combination of the length of the to-be-encoded information bits, the length of the bit sequence obtained after the coding, the first optimization parameter, the third optimization parameter, and the sixth optimization parameter.

Optionally, $J_1'$ and $J_2'$ may be determined in the following manner: After $J_1'$ is determined in the foregoing manner, $J_2'$ is determined based on a sum F of $J_1'$ and $J_2'$. Alternatively, after $J_2'$ is determined in the foregoing manner, $J_1'$ is determined based on a sum F of $J_1'$ and $J_2'$. Alternatively, $J_1'$ and $J_2'$ are separately determined in the foregoing manner, and a sum of $J_1'$ and $J_2'$ is F.

Specifically, a calculation formula of $J_1'$ and a calculation formula of $J_2'$ may be related to one or more of K, M, $w_{min}$, and n, may be represented by using a function f(K, M, $w_{min}$, n), may be independently designed for different M, or may be represented by using a table. The parameter $w_{min}$ indicates a minimum row weight of K highest-reliability sub-channels (bit positions), may be a minimum row weight of K+F highest-reliability sub-channels (bit positions), may be a minimum row weight of K+J' highest-reliability sub-channels (bit positions), may be a minimum row weight of K+J highest-reliability sub-channels (bit positions), or may be obtained by querying a table. The parameter n is a quantity of sub-channels whose row weights are $w_{min}$ in the K highest-reliability sub-channels (bit positions), the K+F highest-reliability sub-channels (bit positions), the K+J' highest-reliability sub-channels (bit positions), or the K+J highest-reliability sub-channels (bit positions). J is a quantity of CRC bits that is equivalent to a FAR required by a system. For example, J=0 indicates that the system requires no FAR, and J=16 indicates that a false alarm rate required by the system is approximately $2^{-16}$.

Optionally, $J_1'=\min(n,\text{integer}(f(K,F)))$, where $f(K,F)=K \times F \times C5 \times 2^{-m}$ or $f(K,F)=K \times F \times C6$, m may be any integer, C5 is any integer, and C6 is any integer.

Optionally, $$J_1' = \min\left(n, \left\lceil \frac{K}{M} * F \right\rceil\right).$$

For example, for M=48, $$J_1' = \min\left(n, \left\lceil \frac{K}{48} * F \right\rceil\right);$$

and for M=64, $$J_1' = \min\left(n, \left\lceil \frac{K}{64} * F \right\rceil\right).$$

Optionally, $J_1'$ and $J_2'$ may be piecewise functions. One segment per K is not precluded, and segments are corresponding to a same value or different values.

For example, $$J_1' = \begin{cases} C1, & \text{if } K < C3 \\ C2, & \text{if } K \geq C3 \end{cases}$$

or $$J_1' = \begin{cases} C1, & \text{if } f(M, K) < C3 \\ C2, & \text{if } f(M, K) \geq C3 \end{cases}.$$

C1, C2, and C3 are any integers, and may be constants, functions related to a CRC bit length, or functions related to a required FAR (false alarm rate). For example, C3 may be equal to 17, 18, or 19.

Optionally, $$J_1' = \begin{cases} 1, & \text{if } M - K > C4 \\ 0, & \text{if } M - K \leq C4 \end{cases}.$$

C4 may be a constant, for example, 192, 33, 49, 30, or 46, may be a function related to a CRC bit length, or may be a function related to a required FAR.

Optionally, $$J_1' = \begin{cases} 1, & \text{if } K < C5 \\ 0, & \text{if } K \leq C5 \end{cases}.$$

C5 may be a constant, for example, 15, 16, 17, or 18, may be a function related to a CRC bit length, or may be a function related to a required FAR.

Optionally, $J_2'$ may be obtained by using a calculation formula that is similar to a calculation formula used to obtain $J_1'$, or may be obtained by subtracting $J_1'$ from the total quantity F.

Optionally, $J_1'$ is obtained based on a pre-stored table in which one or any combination of K, M, F, $w_{min}$, and n is used as an index and a value of $J_1'$ is used as data. $J_2'$ is obtained based on a pre-stored table in which one or any combination of K, M, F, $w_{min}$, and n is used as an index and a value of $J_2'$ is used as data. Optionally, $w_{min}$ may be obtained through calculation, or may be directly included in a table.

For example, $J_1'$, $J_2'$, and $w_{min}$ are represented by using a table. Refer to Table 3, Table 4, Table 5, Table 6, and Table 7. Table 4 has better performance than Table 3.

TABLE 3

| $w_{min}$, $J_1'$, $J_2'$ | K = 12 | K = 13 | K = 14 | K = 15 | K = 16 | K = 17 | K = 18 | K = 19 | K = 20 | K = 21 | K = 22 |
|---|---|---|---|---|---|---|---|---|---|---|---|
| M = 48 | 16, 2, 2 | 16, 2, 2 | 16, 2, 2 | 8, 1, 3 | 8, 1, 2 | 8, 1, 2 | 8, 1, 2 | 8, 2, 1 | 8, 2, 1 | 8, 2, 1 | 8, 3, 0 |
| M = 64 | 16, 2, 2 | 16, 2, 2 | 16, 2, 2 | 8, 1, 3 | 8, 1, 3 | 8, 1, 3 | 8, 2, 2 | 8, 2, 2 | 8, 3, 1 | 8, 3, 1 | 8, 3, 0 |
| M = 96 | 32, 2, 2 | 32, 2, 2 | 32, 2, 2 | 32, 2, 2 | 16, 1, 3 | 16, 1, 3 | 16, 1, 3 | 16, 1, 3 | 16, 2, 2 | 16, 2, 2 | 16, 2, 2 |

TABLE 4

| $w_{min}$, $J_1'$, $J_2'$ | K = 12 | K = 13 | K = 14 | K = 15 | K = 16 | K = 17 | K = 18 | K = 19 | K = 20 | K = 21 | K = 22 |
|---|---|---|---|---|---|---|---|---|---|---|---|
| M = 48 | 16, 2, 2 | 16, 2, 2 | 16, 2, 2 | 16, 2, 1 | 16, 2, 0 or 8, 1, 2 | 16, 1, 0 or 8, 1, 1 | 8, 1, 2 | 8, 1, 1 | 8, 1, 0 | 8, 2, 0 | 8, 2, 1 |
| M = 64 | 16, 0, 4 | 16, 0, 4 or 16, 1, 4 | 16, 0, 4 | 16, 1, 2 | 16, 0, 2 or 8, 1, 4 | 8, 1, 3 | 8, 1, 2 | 8, 2, 2 | 8, 2, 1 | 8, 2, 0 | 8, 5, 0 |

TABLE 4-continued

| $w_{min}$, $J_1'$, $J_2'$ | K = 12 | K = 13 | K = 14 | K = 15 | K = 16 | K = 17 | K = 18 | K = 19 | K = 20 | K = 21 | K = 22 |
|---|---|---|---|---|---|---|---|---|---|---|---|
| M = 80 | 32, 2, 3 | 32, 0, 4 | 32, 2, 2 | 32, 0, 4 | 16, 1, 3 | 16, 1, 2 | 16, 1, 4 | 16, 1, 4 | 16, 1, 4 | 16, 0, 4 | 16, 2, 1 |
| M = 96 | 32, 1, 4 | 32, 0, 4 | 32, 0, 4 | 32, 1, 3 | 16, 1, 3 | 16, 1, 2 | 32, 1, 0 | 16, 1, 3 | 16, 2, 2 | 16, 2, 2 | 16, 2, 1 |

TABLE 5

| $w_{min}$, $J_1'$, $J_2'$ | K = 12 | K = 13 | K = 14 | K = 15 | K = 16 | K = 17 | K = 18 | K = 19 | K = 20 | K = 21 | K = 22 |
|---|---|---|---|---|---|---|---|---|---|---|---|
| M = 48 | 16, 2, 2 | 16, 2, 2 | 16, 2, 2 | 16, 2, 1 | 16, 2, 0 | 16, 0, 4 or 32, 4, 0 | 16, 0, 3 or 32, 3, 0 | 8, 2, 1 | 8, 1, 0 | 8, 3, 0 | 8, 3, 0 |
| M = 64 | 16, 0, 4 or 32, 4, 0 | 16, 0, 4 or 32, 4, 0 | 16, 0, 4 or 32, 4, 0 | 16, 0, 4 or 32, 4, 0 | 16, 0, 2 or 32, 2, 0 | 16, 0, 4 or 32, 4, 0 | 16, 0, 3 or 32, 3, 0 | 8, 4, 2 | 8, 3, 1 | 8, 3, 0 | 8, 6, 0 |
| M = 96 | 32, 1, 4 | 32, 0, 4 or 64, 4, 0 | 32, 0, 4 or 64, 4, 0 | 32, 0, 4 or 64, 4, 0 | 32, 0, 4 or 64, 4, 0 | 32, 0, 4 or 64, 4, 0 | 32, 0, 4 or 64, 4, 0 | 32, 1, 3 | 16, 2, 2 | 16, 3, 1 | 16, 3, 1 |
| M = 128 | 32, 1, 4 | 32, 0, 4 or 64, 4, 0 | 32, 0, 4 or 64, 4, 0 | 32, 0, 4 or 64, 4, 0 | 32, 0, 3 or 64, 3, 0 | 32, 0, 2 or 64, 2, 0 | 32, 1, 4 | 32, 0, 4 or 64, 4, 0 | 16, 2, 3 | 16, 2, 2 | 16, 4, 1 |

TABLE 6

| $w_{min}$, $J_1'$, $J_2'$ | K = 12 | K = 13 | K = 14 | K = 15 | K = 16 | K = 17 | K = 18 | K = 19 | K = 20 | K = 21 | K = 22 |
|---|---|---|---|---|---|---|---|---|---|---|---|
| M = 48 | 16, 2, 2 | 8, 1, 3 | 8, 1, 3 | 8, 1, 3 | 8, 2, 2 | 8, 2, 2 | 8, 3, 1 | 8, 2, 1 | 8, 2, 1 | 8, 2, 1 | 8, 3, 0 |
| M = 64 | 16, 2, 2 | 8, 1, 3 | 8, 1, 3 | 8, 1, 3 | 8, 2, 2 | 8, 2, 2 | 8, 3, 1 | 8, 2, 1 | 8, 2, 1 | 8, 2, 1 | 8, 3, 0 |

TABLE 7

| $w_{min}$, $J_1'$, $J_2'$ | K = 12 | K = 13 | K = 14 | K = 15 | K = 16 | K = 17 | K = 18 | K = 19 | K = 20 | K = 21 | K = 22 |
|---|---|---|---|---|---|---|---|---|---|---|---|
| M = 48 | 16, 2, 2 | 8, 1, 3 | 8, 0, 4 | 8, 1, 3 | 8, 1, 2 | 8, 2, 1 | 8, 3, 2 | 8, 4, 1 | 8, 1, 0 | 8, 6, 0 | 8, 2, 1 |
| M = 64 | 16, 0, 4 | 8, 1, 5 | 8, 1, 4 | 8, 0, 3 | 8, 2, 3 | 8, 2, 3 | 8, 3, 2 | 8, 4, 2 | 8, 2, 1 | 8, 4, 0 | 8, 5, 0 |

For step 200, the performing polar encoding or polar decoding based on the information bit positions and the check bit positions includes:

determining a check equation based on the check bit positions and the information bit positions, where if the check equation is obtained by sequentially arranging at least two elements, a last element indicates a check bit position, remaining elements indicate information bit positions, an element value indicates a sequence number of a corresponding check bit position or information bit position, a sequence number difference between the check bit position and any one of the checked information bit positions is an integral multiple of a specified constant, and the specified constant has one or more values; and performing polar encoding or polar decoding based on the check equation. The specified constant may be 3, 5, 7, 9, or another value.

In view of this, this application further provide the following extended embodiment:

In the foregoing embodiments of this application, because SCL decoding performance is compromise between a code distance and reliability, during check equation construction, to improve performance, bits at some bit positions whose row weights meet $w_{min}$ or $2w_{min}$ may be selected as check bits, and a check equation is constructed by using a modulo 5 register or a modulo 3 register. In a check equation constructed by using the modulo 5 register, a sequence number difference between a check bit position and an information bit position is a multiple of 5. In a check equation constructed by using the modulo 3 register, a sequence number difference between a check bit position and an information bit position is a multiple of 3. The check equation may not necessarily be generated by using only the modulo 5 register, and may be generated by using the modulo 3 register, a multi-tap feedback CRC polynomial register, or a combination of several manners.

For the check equation constructed by using the modulo 5 (or modulo 3) cyclic register, only some information bits may be checked, without a need of checking all information bits that meet a condition. For example, a check bit position of a check bit is 30, information bit positions of information bits that can be checked by using the check bit are 25, 20, 15, 10, 5, and 0, and only one or more of 25, 20, 15, 10, 5, and 0 may be checked. Optionally, a sequence number difference between the bit position of the check bit and a bit position of a checked bit is an integral multiple of 9, 7, 5, or 3. For example, 30 may be used to check one or more of 25, 27, 21, 20, 15, and the like whose difference from 30 is an integral multiple of 9, 7, 5, or 3.

A specific example is used below for description. It is assumed that K is a length of to-be-encoded information bits, M is a code length of a bit sequence obtained after encoding, $M_0$ is a mother code length and $N=2^{ceil(log\ 2(M))}$, and a quantity of available check bits is J'. This application provides a polar encoding/decoding method. A specific process is as follows:

Step 1: Determine a set of K'=K+J' most reliable bit positions in reliability order of polar code.

Step 2: Determine F and a set of K+F most reliable bit positions. F is a total quantity of check bits at bit positions whose row weight values are $w_{min}$ or $2w_{min}$, and is also a quantity of bit positions that are in the set of the K+F most reliable bit positions and are configured as check bit positions and whose row weights meet $w_{min}$ or $2w_{min}$.

$$F = \begin{cases} 4, & \text{if } K/M < 0.33 \\ 3, & \text{if } K/M \geq 0.33 \end{cases}$$

Step 3: Calculate values of $w_{min}$ and n based on F.

The parameter $w_{min}$ is a minimum row weight value of K most reliable bit positions, or $w_{min}$ is a minimum row weight value of the K+F most reliable bit positions, or $w_{min}$ is a minimum row weight value of the K+J' most reliable bit positions; and n is a quantity of bit positions that are in the K most reliable bit positions and whose row weights are equal to $w_{min}$, or n is a quantity of bit positions that are in the K+F most reliable bit positions and whose row weights are equal to $w_{min}$, or n is a quantity of bit positions that are in the K+J' most reliable bit positions and whose row weights are equal to $w_{min}$.

Step 4: Determine $J_1'$, select, from the set of the K+F or K+J' most reliable bit positions, bit positions whose row weights are $w_{min}$ as a first subset, and select $J_1'$ bit positions in descending order of reliability from the first subset as check bit positions.

$$J_1' = \min\left(n, \left\lceil \frac{K}{32} * F \right\rceil\right),$$

where min(x, y) means selecting a minimum value from x and y, and $\lceil x \rceil$ means rounding up.

Step 5: Determine $J_2'$, select, from the set of the K+F most reliable bit positions, bit positions whose row weights are $2 \times w_{min}$ as a second subset, and select $J_2'$ bit positions in descending order of reliability from the second subset as check bit positions.

Optionally, $J_2' = F - J_1'$.

Step 6: Select J'−F bit positions in ascending order of reliability from the set of the K' most reliable bit positions as check bit positions.

Step 7: Remove the selected check bit positions from the set of the K' most reliable bit positions, where remaining K bit positions are information bit positions.

Step 8: Construct a check equation based on the determined check bit positions and information bit positions, where the check equation may be constructed by using a modulo 5 shift register, and a sequence number distance between the check bit position and the information bit position is a multiple of 5.

An order of step 4, step 5, and step 6 may be randomly changed without affecting a final result.

For the foregoing embodiments, if J' is 6 and M=48, a detailed construction parameter of polar code for which K=12 to 22 includes a processing position in a rate matching manner, for example, a puncturing or shortening position. The processing position is represented by P. If J' is 6 and M=64, a processing position P in the rate matching manner in a detailed construction parameter of polar code for which K=12 to 22 is a null set.

It should be noted that in this embodiment of this application, a sequence number of a bit position starts from 0 or may start from 1. Any Set of construction parameters in this application means that if a check equation or check function includes at least two elements, a last one of the elements is a check bit position, and a value of the last element is obtained by performing an addition modulo 2 operation on values of other elements in the check equation. For example, if a check equation is [1 3 5 7], bit positions 1, 3, and 5 are information bit positions. If values of the information bit positions are $u_1$, $u_3$, and $u_5$, respectively, a value $u_7$ of a check bit position is equal to $mod(u_1+u_3+u_5, 2)$. For another example, for a check equation [1], if a first bit position is included P puncturing/shortening positions, the first bit position is a puncturing/shortening bit positions. If the first bit position, that is, positions 1 is not included in the P puncturing/shortening bit positions, the first bit position is a frozen bit position. In all bit positions with a mother code length, a bit position other than a puncturing/shortening bit position or a frozen/check bit position is an information bit position for placing an information bit.

Optionally, if J' is 6, M=48, and a rate matching manner indicated by R is puncturing, detailed construction parameters of K=12 to 22 provided in this application are shown in the following Set 1 to Set 11.

For example, in Set 1, P is a processing position in the rate matching manner, for example, a puncturing or shortening position, F/PF (frozen/parity function) parity function set comprises one or more check functions, and the check function set includes one or more elements.

For example, [0], [1], [2], [3], [4], [5], [6], [7], [8], [9], [10], [11], [12], [13], [14], [15] in Set 1 are included in P, and therefore elements in these check equations indicate puncturing/shortening positions. If the check equation in Set 1 includes at least two elements, for example, check equations [53, 58], [30, 45, 55, 60], [31, 46, 51, 61], and [47, 57, 62] include two elements, four elements, four elements, and three elements, respectively, the elements in these check equations are not included in P and indicate information bit positions or check bit positions. A last element in each check equation indicates a check bit position, and remaining elements indicate positions, checked by using the check bit position, of information bits, namely, information bit positions. For example, a last element 62 in the check equation [47, 57, 62] indicates a check bit position, and 47 and 57 indicate information bit positions checked by using the check bit position 62. Bit positions represented by elements in other check equations that each include only one element and that are not included in P are frozen bit positions. For example:

[16], [17], [18], [19], [20], [21], [22], [23], [24], [25], [26], [27], [28], [29], [32], [33], [34], [35], [36], [37], [38], [39], [40], [41], [42], [43], [44], [48], [49], [50], [52], [56].

Elements in another Set in the embodiments of this application have functions similar to those of the elements described above. Details are not described herein.

In Set 1, K=12 and M=48;

P={[0], [1], [2], [3], [4], [5], [6], [7], [8], [9], [10], [11], [12], [13], [14], [15]}; and F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34],

[35], [36], [37], [38], [39], [40], [41], [42], [43], [44], [48], [49], [50], [52], [56], [53, 58], [30, 45, 55, 60], [31, 46, 51, 61], [47, 57, 62]}.

In Set 2, K=13 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [44], [48], [49], [50], [52], [31, 46, 51, 56], [43, 53, 58], [30, 45, 55, 60], [31, 46, 51, 61], [47, 57, 62]}.

In Set 3, K=14 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [52], [31, 46, 51, 56], [43, 53, 58], [30, 45, 55, 60], [31, 46, 51, 61], [47, 57, 62]}.

In Set 4, K=15 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [52], [31, 46, 51, 56], [47, 57], [43, 53, 58], [30, 45, 55, 60]}.

In Set 5, K=16 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [47, 52], [31, 46, 51, 56], [43, 53, 58], [30, 45, 55, 60]}.

In Set 6, K=17 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [40], [41], [42], [44], [48], [49], [50], [47, 52], [31, 46, 51, 56], [43, 53, 58], [30, 45, 55, 60]}.

In Set 7, K=18 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [44], [48], [49], [30, 45, 50], [27, 47, 52], [31, 46, 51, 56], [43, 53, 58], [30, 45, 55, 60]}.

In Set 8, K=19 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [29, 39, 44], [48], [49], [30, 45, 50], [27, 47, 52], [31, 46, 51, 56], [30, 45, 55, 60]}.

In Set 9, K=20 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42], [29, 39, 44], [48], [29, 39, 49], [30, 45, 50], [27, 47, 52], [31, 46, 51, 56], [30, 45, 55, 60]}.

In Set 10, K=21 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [27, 42], [29, 39, 44], [48], [29, 39, 49], [27, 47, 52], [31, 46, 51, 56], [30, 45, 50, 55, 60]}.

In Set 11, K=22 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [24], [25], [26], [23, 28], [32], [33], [34], [35], [36], [37], [38], [40], [41], [27, 42], [48], [29, 39, 44, 49], [30, 45, 50], [27, 47, 52], [31, 46, 51, 56]}.

For the foregoing embodiments, if J' is 6, M=64, and a rate matching manner indicated by R is that puncturing or shortening is not required, detailed construction parameters of K=12 to 22 are shown in the following Set 12 to Set 22:

In Set 12, K=12 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [43], [44], [48], [49], [50], [52], [56], [53, 58], [30, 45, 55, 60], [31, 46, 51, 61], [47, 57, 62]}.

In Set 13, K=13 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [44], [48], [49], [50], [52], [31, 46, 51, 56], [43, 53, 58], [30, 45, 55, 60], [31, 46, 51, 61], [47, 57, 62]}.

In Set 14, K=14 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [52], [31, 46, 51, 56], [43, 53, 58], [30, 45, 55, 60], [31, 46, 51, 61], [47, 57, 62]}.

In Set 15, K=15 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [52], [31, 46, 51, 56], [47, 57], [43, 53, 58], [30, 45, 55, 60]}.

In Set 16, K=16 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [40], [41], [42], [44], [48], [49], [50], [47, 52], [31, 46, 51, 56], [47, 57], [43, 53, 58], [30, 45, 55, 60]}.

In Set 17, K=17 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36],

[37], [38], [40], [41], [42], [44], [48], [49], [50], [27, 47, 52], [31, 46, 51, 56], [27, 47, 57], [43, 53, 58], [30, 45, 55, 60]}.

In Set 18, K=18 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [44], [48], [49], [30, 45, 50], [27, 47, 52], [31, 46, 51, 56], [43, 53, 58], [30, 45, 55, 60]}.

In Set 19, K=19 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42], [29, 39, 44], [48], [49], [30, 45, 50], [27, 47, 52], [31, 46, 51, 56], [23, 43, 53, 58], [30, 45, 55, 60]}.

In Set 20, K=20 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42], [29, 39, 44], [48], [29, 39, 49], [30, 45, 50], [27, 47, 52], [31, 46, 51, 56], [30, 45, 55, 60]}.

In Set 21, K=21 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42], [48], [29, 39, 44, 49], [30, 45, 50], [27, 47, 52], [31, 46, 51, 56], [30, 45, 55, 60]}.

In Set 22, K=22 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [27, 42], [48], [29, 39, 44, 49], [30, 45, 50], [27, 47, 52], [31, 46, 51, 56]}.

For the foregoing embodiments, if J' is 8 and M=48, detailed construction parameters of K=12 to 22 are as follows:

In Set 23, K=12 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [43], [44], [48], [49], [50], [52], [31, 46, 51, 56], [53, 58], [30, 45, 55, 60], [31, 46, 51, 61], [47, 57, 62]}.

In Set 24, K=13 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [44], [48], [49], [50], [52], [31, 46, 51, 56], [43, 53, 58], [30, 45, 55, 60], [31, 46, 51, 61], [47, 57, 62]}.

In Set 25, K=14 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [47, 52], [31, 46, 51, 56], [43, 53, 58], [30, 45, 55, 60], [31, 46, 51, 61], [47, 57, 62]}.

In Set 26, K=15 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [47, 52], [31, 46, 51, 56], [47, 57], [43, 53, 58], [30, 45, 55, 60]}.

In Set 27, K=16 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [30, 45, 50], [47, 52], [31, 46, 51, 56], [43, 53, 58], [30, 45, 55, 60]}.

In Set 28, K=17 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [40], [41], [42], [29, 39, 44], [48], [49], [30, 45, 50], [47, 52], [31, 46, 51, 56], [43, 53, 58], [30, 45, 55, 60]}.

In Set 29, K=18 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [29, 39, 44], [48], [29, 39, 49], [30, 45, 50], [27, 47, 52], [31, 46, 51, 56], [43, 53, 58], [30, 45, 55, 60]}.

In Set 30, K=19 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [27, 42], [29, 39, 44], [48], [29, 39, 49], [30, 45, 50], [27, 47, 52], [31, 46, 51, 56], [30, 45, 55, 60]}.

In Set 31, K=20 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [24], [25], [26], [23, 28], [32], [33], [34], [35], [36], [37], [38], [40], [41], [27, 42], [29, 39, 44], [48], [29, 39, 49], [30, 45, 50], [27, 47, 52], [31, 46, 51, 56], [30, 45, 55, 60]}.

In Set 32, K=21 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [24], [25], [26], [23, 28], [32], [33], [34], [35], [36], [37], [38], [40], [31, 41], [27, 42], [29, 39, 44], [48], [29, 39, 49], [27, 47, 52], [31, 46, 51, 56], [30, 45, 50, 55, 60]}.

In Set 33, K=22 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21],

[22], [24], [25], [26], [23, 28], [32], [33], [34], [35], [36], [37], [23, 38], [40], [31, 41], [27, 42], [48], [29, 39, 44, 49], [30, 45, 50], [27, 47, 52], [31, 46, 51, 56]}.

For the foregoing embodiments, if J' is 8 and M=64, detailed construction parameters of K=12 to 22 are as follows:

In Set 34, K=12 and M=64; P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [43], [44], [48], [49], [50], [52], [31, 46, 51, 56], [53, 58], [30, 45, 55, 60], [31, 46, 51, 61], [47, 57, 62]}.

In Set 35, K=13 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [44], [48], [49], [50], [52], [31, 46, 51, 56], [43, 53, 58], [30, 45, 55, 60], [31, 46, 51, 61], [47, 57, 62]}.

In Set 36, K=14 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [47, 52], [31, 46, 51, 56], [43, 53, 58], [30, 45, 55, 60], [31, 46, 51, 61], [47, 57, 62]}.

In Set 37, K=15 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [47, 52], [31, 46, 51, 56], [47, 57], [43, 53, 58], [30, 45, 55, 60]}.

In Set 38, K=16 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [40], [41], [42], [44], [48], [49], [30, 45, 50], [47, 52], [31, 46, 51, 56], [47, 57], [43, 53, 58], [30, 45, 55, 60]}.

In Set 39, K=17 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [29, 39, 44], [48], [49], [30, 45, 50], [27, 47, 52], [31, 46, 51, 56], [27, 47, 57], [43, 53, 58], [30, 45, 55, 60]}.

In Set 40, K=18 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [29, 39, 44], [48], [29, 39, 49], [30, 45, 50], [27, 47, 52], [31, 46, 51, 56], [43, 53, 58], [30, 45, 55, 60]}.

In Set 41, K=19 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42], [29, 39, 44], [48], [29, 39, 49], [30, 45, 50], [27, 47, 52], [31, 46, 51, 56], [23, 43, 53, 58], [30, 45, 55, 60]}.

In Set 42, K=20 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [27, 42], [29, 39, 44], [48], [29, 39, 49], [30, 45, 50], [27, 47, 52], [31, 46, 51, 56], [30, 45, 55, 60]}.

In Set 43, K=21 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [23, 28], [32], [33], [34], [35], [36], [37], [38], [40], [41], [27, 42], [48], [29, 39, 44, 49], [30, 45, 50], [27, 47, 52], [31, 46, 51, 56], [30, 45, 55, 60]}.

In Set 44, K=22 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [23, 28], [32], [33], [34], [35], [36], [37], [38], [40], [31, 41], [27, 42], [48], [29, 39, 44, 49], [30, 45, 50], [27, 47, 52], [31, 46, 51, 56]}.

Detailed construction parameters with better performance that are obtained based on any one of the foregoing embodiments of this application are specifically as follows:

If J' is 6 and M=48, 64, 80, or 96, detailed construction parameters of polar code for which K=12 to 22 are as follows:

In Set 45, K=12 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [43], [44], [48], [49], [50], [52], [56], [53, 58], [30, 45, 55, 60], [31, 46, 51, 61], [47, 57, 62]}.

In Set 46, K=13 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [44], [48], [49], [50], [52], [31, 46, 51, 56], [43, 53, 58], [30, 45, 55, 60], [31, 46, 51, 61], [47, 57, 62]}.

In Set 47, K=14 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [52], [31, 46, 51, 56], [43, 53, 58], [30, 45, 55, 60], [31, 46, 51, 61], [47, 57, 62]}.

In Set 48, K=15 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35],

[36], [37], [38], [29, 39], [40], [41], [42], [44], [48], [49], [50], [52], [31, 46, 51, 56], [43, 53, 58], [30, 45, 55, 60], [47, 57, 62]}.

In Set 49, K=16 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [47, 52], [31, 46, 51, 56], [43, 53, 58], [30, 45, 55, 60]}.

In Set 50, K=17 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [47, 52], [31, 46, 51, 56], [30, 45, 55, 60]}.

In Set 51, K=18 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [44], [48], [49], [30, 45, 50], [27, 47, 52], [31, 46, 51, 56], [43, 53, 58], [30, 45, 55, 60]}.

In Set 52, K=19 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [29, 39, 44], [48], [49], [30, 45, 50], [27, 47, 52], [31, 46, 51, 56], [30, 45, 55, 60]}.

In Set 53, K=20 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [29, 39, 44], [48], [29, 39, 49], [30, 45, 50], [27, 47, 52], [31, 46, 51, 56]}.

In Set 54, K=21 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [27, 42], [29, 39, 44], [48], [29, 39, 49], [30, 45, 50], [27, 47, 52], [31, 46, 51, 56]}.

In Set 55, K=22 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [24], [25], [26], [23, 28], [32], [33], [34], [35], [36], [37], [38], [40], [41], [27, 42], [48], [29, 39, 44, 49], [27, 47, 52], [31, 46, 51, 56], [30, 45, 50, 55, 60]}.

In Set 56, K=12 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [43], [44], [48], [49], [50], [52], [30, 45, 55], [56], [54, 59], [31, 46, 51, 61], [47, 57, 62]}.

In Set 57, K=13 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [44], [48], [49], [50], [52], [30, 45, 55], [31, 46, 51, 56], [54, 59], [31, 46, 51, 61], [47, 57, 62]}.

In Set 58, K=14 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [52], [30, 45, 55], [31, 46, 51, 56], [29, 54, 59], [31, 46, 51, 61], [47, 57, 62]}.

In Set 59, K=15 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [52], [31, 46, 51, 56], [30, 45, 55, 60], [31, 46, 51, 61], [47, 57, 62]}.

In Set 60, K=16 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [47, 52], [31, 46, 51, 56], [31, 46, 51, 61], [47, 57, 62]}.

In Set 61, K=17 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [44], [48], [49], [50], [27, 47, 52], [31, 46, 51, 56], [27, 47, 57], [43, 53, 58], [30, 45, 55, 60]}.

In Set 62, K=18 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [44], [48], [49], [30, 45, 50], [27, 47, 52], [31, 46, 51, 56], [43, 53, 58], [30, 45, 55, 60]}.

In Set 63, K=19 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42], [29, 39, 44], [48], [49], [30, 45, 50], [27, 47, 52], [31, 46, 51, 56], [23, 43, 53, 58], [30, 45, 55, 60]}.

In Set 64, K=20 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42], [29, 39, 44], [48], [29, 39, 49], [30, 45, 50], [27, 47, 52], [31, 46, 51, 56], [30, 45, 55, 60]}.

In Set 65, K=21 and M=64;
P=Null set; and
F/PF={[0], [1], [2], [3], [4], [5], [6], [7], [8], [9], [10], [11], [12], [13], [14], [15], [16], [17], [18], [19], [20], [21],

[22], [24], [25], [26], [28], [32], [33], [34], [35], [36], [37], [38], [40], [41], [42], [29, 39, 44], [48], [29, 39, 49], [30, 45, 50], [27, 47, 52], [31, 46, 51, 56]}.

In Set 66, K=22 and M=64;
P=Null set; and
F/PF={[0], [1], [2], [3], [4], [5], [6], [7], [8], [9], [10], [11], [12], [13], [14], [16], [17], [18], [19], [20], [21], [22], [24], [25], [26], [28], [32], [33], [34], [35], [36], [37], [38], [40], [41], [27, 42], [29, 39, 44], [48], [29, 39, 49], [15, 30, 45, 50], [27, 47, 52], [31, 46, 51, 56]}.

In Set 67, K=12 and M=80;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [64], [65], [66], [67], [68], [69], [70], [71]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [93], [96], [97], [98], [99], [100], [101], [102], [103], [104], [105], [106], [107], [108], [112], [113], [114], [116], [120], [117, 122], [63, 118, 123], [94, 109, 119, 124], [95, 110, 115, 125], [111, 121, 126]}.

In Set 68, K=13 and M=80;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [64], [65], [66], [67], [68], [69], [70], [71]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [63, 93], [96], [97], [98], [99], [100], [101], [102], [103], [104], [105], [106], [107], [108], [112], [113], [114], [116], [94, 109, 119], [120], [63, 118, 123], [95, 110, 115, 125], [111, 121, 126]}.

In Set 69, K=14 and M=80;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [64], [65], [66], [67], [68], [69], [70], [71]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [63, 93], [96], [97], [98], [99], [100], [101], [102], [103], [104], [105], [106], [108], [112], [113], [114], [116], [95, 110, 115, 120], [107, 117, 122], [94, 109, 119, 124], [95, 110, 115, 125], [111, 121, 126]}.

In Set 70, K=15 and M=80;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [64], [65], [66], [67], [68], [69], [70], [71]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [96], [97], [98], [99], [100], [101], [102], [63, 93, 103], [104], [105], [106], [108], [112], [113], [114], [116], [94, 109, 119], [95, 110, 115, 120], [63, 93, 118, 123], [95, 110, 115, 125], [111, 121, 126]}.

In Set 71, K=16 and M=80;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [64], [65], [66], [67], [68], [69], [70], [71]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [96], [97], [98], [99], [100], [101], [102], [63, 93, 103], [104], [105], [106], [108], [112], [113], [114], [116], [95, 110, 115, 120], [111, 121], [107, 117, 122], [94, 109, 119, 124]}.

In Set 72, K=17 and M=80;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [64], [65], [66], [67], [68], [69], [70], [71]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [96], [97], [98], [99], [100], [101], [102], [63, 93, 103], [104], [105], [106], [108], [112], [113], [114], [116], [95, 110, 115, 120], [107, 117, 122], [94, 109, 119, 124]}.

In Set 73, K=18 and M=80;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [64], [65], [66], [67], [68], [69], [70], [71]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [64], [65], [66], [67], [68], [69], [70], [71], [72], [73], [74], [75], [76], [77], [78], [79], [80], [81], [82], [83], [84], [85], [86], [87], [88], [89], [90], [92], [96], [97], [98], [99], [100], [101], [102], [104], [105], [106], [108], [112], [113], [114], [91, 111, 116], [63, 93, 103, 118], [95, 110, 115, 120], [91, 111, 121], [62, 107, 117, 122], [94, 109, 119, 124]}.

In Set 74, K=19 and M=80;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [64], [65], [66], [67], [68], [69], [70], [71]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [64], [65], [66], [67], [68], [69], [70], [71], [72], [73], [74], [75], [76], [77], [78], [79], [80], [81], [82], [83], [84], [85], [86], [87], [88], [89], [90], [92], [96], [97], [98], [99], [100], [101], [102], [104], [105], [106], [108], [112], [113], [114], [63, 93, 103, 118], [95, 110, 115, 120], [91, 111, 116, 121], [62, 107, 117, 122], [94, 109, 119, 124]}.

In Set 75, K=20 and M=80;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [64], [65], [66], [67], [68], [69], [70], [71]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [64], [65], [66], [67], [68], [69], [70], [71], [72], [73], [74], [75], [76], [77], [78], [79], [80], [81], [82], [83], [84], [85], [86], [62, 87], [88], [89], [90], [92], [96], [97], [98], [99], [100], [101], [102], [104], [105], [106], [108], [112], [113], [114], [63, 93, 103, 118], [95, 110, 115, 120], [61, 91, 111, 116, 121], [62, 107, 117, 122], [94, 109, 119, 124]}.

In Set 76, K=21 and M=80;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [64], [65], [66], [67], [68], [69], [70], [71]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [64], [65], [66], [67], [68], [69], [70], [71], [72], [73], [74], [75], [76], [77], [78], [79], [80], [81], [82], [83], [84], [85], [86], [62, 87], [88], [89], [90], [92], [96], [97], [98], [99], [100], [101], [102], [104], [105], [106], [108], [112], [113], [94, 109, 114], [63, 93, 103, 118], [61, 91, 111, 116, 121], [62, 107, 117, 122], [94, 109, 119, 124]}.

In Set 77, K=22 and M=80;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [64], [65], [66], [67], [68], [69], [70], [71]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [64], [65], [66], [67], [68], [69], [70], [71], [72], [73], [74], [75], [76], [77], [78], [79], [80], [81], [82], [83], [84], [85], [86], [62, 87], [88], [89], [90], [92], [96], [97], [98], [99], [100], [101], [102], [104], [105], [106], [63, 93, 103, 108], [112], [113], [94, 109, 114], [61, 91, 111, 116], [95, 110, 115, 120], [94, 109, 119, 124]}.

In Set 78, M=96: puncturing; and
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]}.

In Set 79, K=12 and M=96;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [93], [96], [97], [98], [99], [100], [101], [102], [103], [104], [105], [106], [107], [108], [112], [113], [114], [116], [94, 109, 119], [120], [63, 118, 123], [94, 109, 124], [95, 110, 115, 125], [111, 121, 126]}.

In Set 80, K=13 and M=96;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [63, 93], [96], [97], [98], [99], [100], [101], [102], [103], [104], [105], [106], [107], [108], [112], [113], [114], [116], [94, 109, 119], [120], [63, 118, 123], [95, 110, 115, 125], [111, 121, 126]}.

In Set 81, K=14 and M=96;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [63, 93], [96], [97], [98], [99], [100], [101], [102], [103], [104], [105], [106], [108], [112], [113], [114], [116], [94, 109, 119], [95, 110, 115, 120], [63, 118, 123], [95, 110, 115, 125], [111, 121, 126]}.

In Set 82, K=15 and M=96;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54],

[55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [96], [97], [98], [99], [100], [101], [102], [63, 93, 103], [104], [105], [106], [108], [112], [113], [114], [116], [95, 110, 115, 120], [63, 93, 118, 123], [94, 109, 119, 124], [95, 110, 115, 125], [111, 121, 126]}.

In Set 83, K=16 and M=96;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [96], [97], [98], [99], [100], [101], [102], [63, 93, 103], [104], [105], [106], [108], [112], [113], [114], [116], [95, 110, 115, 120], [111, 121], [107, 117, 122], [94, 109, 119, 124]}.

In Set 84, K=17 and M=96;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [96], [97], [98], [99], [100], [101], [102], [63, 93, 103], [104], [105], [106], [108], [112], [113], [114], [116], [95, 110, 115, 120], [107, 117, 122], [94, 109, 119, 124]}.

In Set 85, K=18 and M=96;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [96], [97], [98], [99], [100], [101], [102], [63, 93, 103], [104], [105], [106], [108], [112], [113], [114], [111, 116], [95, 110, 115, 120], [94, 109, 119, 124]}.

In Set 86, K=19 and M=96;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [64], [65], [66], [67], [68], [69], [70], [71], [72], [73], [74], [75], [76], [77], [78], [79], [80], [81], [82], [83], [84], [85], [86], [87], [88], [89], [90], [91], [92], [96], [97], [98], [99], [100], [101], [102], [104], [105], [106], [108], [112], [113], [114], [91, 111, 116], [95, 110, 115, 120], [91, 111, 121], [62, 107, 117, 122], [94, 109, 119, 124]}.

In Set 87, K=20 and M=96;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [64], [65], [66], [67], [68], [69], [70], [71], [72], [73], [74], [75], [76], [77], [78], [79], [80], [81], [82], [83], [84], [85], [86], [62, 87], [88], [89], [90], [92], [96], [97], [98], [99], [100], [101], [102], [104], [105], [106], [108], [112], [113], [114], [91, 111, 116], [95, 110, 115, 120], [62, 107, 117, 122], [94, 109, 119, 124]}.

In Set 88, K=21 and M=96;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [64], [65], [66], [67], [68], [69], [70], [71], [72], [73], [74], [75], [76], [77], [78], [79], [80], [81], [82], [83], [84], [85], [86], [62, 87], [88], [89], [90], [92], [96], [97], [98], [99], [100], [101], [102], [104], [105], [106], [108], [112], [113], [94, 109, 114], [61, 91, 111, 116], [95, 110, 115, 120], [62, 107, 117, 122], [94, 109, 119, 124]}.

In Set 89, K=22 and M=96;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [64], [65], [66], [67], [68], [69], [70], [71], [72], [73], [74], [75], [76], [77], [78], [79], [80], [81], [82], [83], [84], [85], [86], [62, 87], [88], [89], [90], [92], [96], [97], [98], [99], [100], [101], [102], [104], [105], [106], [63, 93, 103, 108], [112], [113], [94, 109, 114], [61, 91, 111, 116], [95, 110, 115, 120], [94, 109, 119, 124]}.

Based on the foregoing embodiments of this application, if J' is 8 and M=48, 64, 80, or 96, detailed construction parameters of polar code for which K=12 to 22 are as follows:

In Set 90, K=12 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [43], [44], [48], [49], [50], [52], [31, 46, 51, 56], [53, 58], [30, 45, 55, 60], [31, 46, 51, 61], [47, 57, 62]}.

In Set 91, K=13 and M=48;
P={[0], [1], [2], [3], [4], [5], [6], [7], [8], [9], [10], [11], [12], [13], [14], [15]}; and F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [44], [48], [49], [50], [52], [31, 46, 51, 56], [43, 53, 58], [30, 45, 55, 60], [31, 46, 51, 61], [47, 57, 62]}.

In Set 92, K=14 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [47, 52], [31, 46, 51, 56], [43, 53, 58], [30, 45, 55, 60], [31, 46, 51, 61], [47, 57, 62]}.

In Set 93, K=15 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [47, 52], [31, 46, 51, 56], [43, 53, 58], [30, 45, 55, 60], [47, 57, 62]}.

In Set 94, K=16 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [30, 45, 50], [47, 52], [31, 46, 51, 56], [43, 53, 58], [30, 45, 55, 60]}.

In Set 95, K=17 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [29, 44], [48], [49], [30, 45, 50], [47, 52], [31, 46, 51, 56], [30, 45, 55, 60]}.

In Set 96, K=18 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [29, 39, 44], [48], [29, 39, 49], [30, 45, 50], [27, 47, 52], [31, 46, 51, 56], [43, 53, 58], [30, 45, 55, 60]}.

In Set 97, K=19 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [27, 42], [29, 39, 44], [48], [29, 39, 49], [30, 45, 50], [27, 47, 52], [31, 46, 51, 56], [30, 45, 55, 60]}.

In Set 98, K=20 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [27, 42], [29, 39, 44], [48], [29, 39, 49], [30, 45, 50], [27, 47, 52], [31, 46, 51, 56]}.

In Set 99, K=21 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [24], [25], [26], [23, 28], [32], [33], [34], [35], [36], [37], [38], [40], [31, 41], [27, 42], [29, 39, 44], [48], [29, 39, 49], [30, 45, 50], [27, 47, 52], [31, 46, 51, 56]}.

In Set 100, K=22 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [24], [25], [26], [23, 28], [32], [33], [34], [35], [36], [37], [23, 38], [40], [31, 41], [27, 42], [48], [29, 39, 44, 49], [27, 47, 52], [31, 46, 51, 56], [30, 45, 50, 55, 60]}.

In Set 101, K=12 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [43], [44], [48], [49], [50], [52], [30, 45, 55], [31, 46, 51, 56], [54, 59], [31, 46, 51, 61], [47, 57, 62]}.

In Set 102, K=13 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [44], [48], [49], [50], [52], [30, 45, 55], [31, 46, 51, 56], [54, 59], [31, 46, 51, 61], [47, 57, 62]}.

In Set 103, K=14 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [47, 52], [30, 45, 55], [31, 46, 51, 56], [29, 54, 59], [31, 46, 51, 61], [47, 57, 62]}.

In Set 104, K=15 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [47, 52], [31, 46, 51, 56], [30, 45, 55, 60], [31, 46, 51, 61], [47, 57, 62]}.

In Set 105, K=16 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [30, 45, 50], [47, 52], [31, 46, 51, 56], [31, 46, 51, 61], [47, 57, 62]}.

In Set 106, K=17 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [29, 39, 44], [48], [49], [30, 45, 50], [27, 47, 52], [31, 46, 51, 56], [27, 47, 57], [43, 53, 58], [30, 45, 55, 60]}.

In Set 107, K=18 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [29, 39, 44], [48], [29, 39, 49], [30, 45, 50], [27, 47, 52], [31, 46, 51, 56], [43, 53, 58], [30, 45, 55, 60]}.

In Set 108, K=19 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42], [29, 39, 44], [48], [29, 39, 49], [30, 45, 50], [27, 47, 52], [31, 46, 51, 56], [23, 43, 53, 58], [30, 45, 55, 60]}.

In Set 109, K=20 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [27, 42], [29, 39, 44], [48], [29, 39, 49], [30, 45, 50], [27, 47, 52], [31, 46, 51, 56], [30, 45, 55, 60]}.

In Set 110, K=21 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [23, 28], [32], [33], [34], [35], [36], [37], [38], [40], [41], [27, 42], [29, 39, 44], [48], [29, 39, 49], [30, 45, 50], [27, 47, 52], [31, 46, 51, 56]}.

In Set 111, K=22 and M=64;
P=Null set; and
F/PF={[0], [1], [2], [3], [4], [5], [6], [7], [8], [9], [10], [11], [12], [13], [14], [16], [17], [18], [19], [20], [21], [22], [24], [25], [26], [23, 28], [32], [33], [34], [35], [36], [37], [38], [40], [31, 41], [27, 42], [29, 39, 44], [48], [29, 39, 49], [15, 30, 45, 50], [27, 47, 52], [31, 46, 51, 56]}.

In Set 112, K=12 and M=80;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [64], [65], [66], [67], [68], [69], [70], [71]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [63, 93], [96], [97], [98], [99], [100], [101], [102], [103], [104], [105], [106], [107], [108], [112], [113], [114], [116], [95, 110, 115, 120], [117, 122], [63, 118, 123], [94, 109, 119, 124], [95, 110, 115, 125], [111, 121, 126]}.

In Set 113, K=13 and M=80;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [64], [65], [66], [67], [68], [69], [70], [71]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [63, 93], [96], [97], [98], [99], [100], [101], [102], [63, 103], [104], [105], [106], [107], [108], [112], [113], [114], [116], [94, 109, 119], [95, 110, 115, 120], [63, 118, 123], [95, 110, 115, 125], [111, 121, 126]}.

In Set 114, K=14 and M=80;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [64], [65], [66], [67], [68], [69], [70], [71]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [63, 93], [96], [97], [98], [99], [100], [101], [102], [63, 103], [104], [105], [106], [108], [112], [113], [114], [116], [95, 110, 115, 120], [107, 117, 122], [94, 109, 119, 124], [95, 110, 115, 125], [111, 121, 126]}.

In Set 115, K=15 and M=80;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [64], [65], [66], [67], [68], [69], [70], [71]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [96], [97], [98], [99], [100], [101], [102], [63, 93, 103], [104], [105], [106], [108], [112], [113], [114], [116], [94, 109, 119], [95, 110, 115, 120], [63, 93, 118, 123], [95, 110, 115, 125], [111, 121, 126]}.

In Set 116, K=16 and M=80;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [64], [65], [66], [67], [68], [69], [70], [71]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [96], [97], [98], [99], [100], [101], [102], [63, 93, 103], [104], [105], [106], [108], [112], [113], [114], [111, 116], [95, 110, 115, 120], [111, 121], [107, 117, 122], [94, 109, 119, 124]}.

In Set 117, K=17 and M=80;
P={[0], [1], [2], [3], [4], [5], [6], [7], [8], [9], [10], [11], [12], [13], [14], [15], [16], [17], [18], [19], [20], [21], [22],

[23], [24], [25], [26], [27], [28], [29], [30], [31], [32], [33], [34], [35], [36], [37], [38], [39], [64], [65], [66], [67], [68], [69], [70], [71]} and 1;

F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [96], [97], [98], [99], [100], [101], [102], [63, 93, 103], [104], [105], [106], [108], [112], [113], [114], [111, 116], [95, 110, 115, 120], [107, 117, 122], [94, 109, 119, 124]}.

In Set 118, K=18 and M=80;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [64], [65], [66], [67], [68], [69], [70], [71]}; and F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [64], [65], [66], [67], [68], [69], [70], [71], [72], [73], [74], [75], [76], [77], [78], [79], [80], [81], [82], [83], [84], [85], [86], [62, 87], [88], [89], [90], [92], [96], [97], [98], [99], [100], [101], [102], [104], [105], [106], [108], [112], [113], [114], [91, 111, 116], [63, 93, 103, 118], [95, 110, 115, 120], [91, 111, 121], [62, 107, 117, 122], [94, 109, 119, 124]}.

In Set 119, K=19 and M=80;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [64], [65], [66], [67], [68], [69], [70], [71]}; and F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [64], [65], [66], [67], [68], [69], [70], [71], [72], [73], [74], [75], [76], [77], [78], [79], [80], [81], [82], [83], [84], [85], [86], [62, 87], [88], [89], [90], [92], [96], [97], [98], [99], [100], [101], [102], [104], [105], [106], [108], [112], [113], [94, 109, 114], [63, 93, 103, 118], [95, 110, 115, 120], [91, 111, 116, 121], [62, 107, 117, 122], [94, 109, 119, 124]}.

In Set 120, K=20 and M=80;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [64], [65], [66], [67], [68], [69], [70], [71]}; and F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [64], [65], [66], [67], [68], [69], [70], [71], [72], [73], [74], [75], [76], [77], [78], [79], [80], [81], [82], [83], [84], [85], [86], [62, 87], [88], [89], [90], [92], [96], [97], [98], [99], [100], [101], [102], [104], [105], [106], [63, 93, 103, 108], [112], [113], [94, 109, 114], [63, 93, 103, 118], [95, 110, 115, 120], [61, 91, 111, 116, 121], [62, 107, 117, 122], [94, 109, 119, 124]}.

In Set 121, K=21 and M=80;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [64], [65], [66], [67], [68], [69], [70], [71]}; and F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [64], [65], [66], [67], [68], [69], [70], [71], [72], [73], [74], [75], [76], [77], [78], [79], [80], [81], [82], [83], [84], [85], [86], [62, 87], [88], [89], [90], [92], [96], [97], [98], [99], [100], [101], [102], [104], [105], [106], [63, 93, 103, 108], [112], [113], [94, 109, 114], [63, 93, 103, 118], [61, 91, 111, 116, 121], [62, 107, 117, 122], [94, 109, 119, 124]}.

In Set 122, K=22 and M=80;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [64], [65], [66], [67], [68], [69], [70], [71]} and F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [64], [65], [66], [67], [68], [69], [70], [71], [72], [73], [74], [75], [76], [77], [78], [79], [80], [81], [82], [83], [84], [85], [86], [62, 87], [88], [89], [90], [92], [96], [97], [98], [99], [100], [101], [102], [104], [105], [106], [63, 93, 103, 108], [112], [63, 93, 103, 113], [94, 109, 114], [61, 91, 111, 116], [95, 110, 115, 120], [94, 109, 119, 124]}.

In Set 123, K=12 and M=96;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]}; and F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [63, 93], [96], [97], [98], [99], [100], [101], [102], [103], [104], [105], [106], [107], [108], [112], [113], [114], [116], [94, 109, 119], [95, 110, 115, 120], [63, 118, 123], [94, 109, 124], [95, 110, 115, 125], [111, 121, 126]}.

In Set 124, K=13 and M=96;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]}; and F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88],

[89], [90], [91], [92], [63, 93], [96], [97], [98], [99], [100], [101], [102], [63, 103], [104], [105], [106], [107], [108], [112], [113], [114], [116], [94, 109, 119], [95, 110, 115, 120], [63, 118, 123], [95, 110, 115, 125], [111, 121, 126]}.

In Set 125, K=14 and M=96;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [63, 93], [96], [97], [98], [99], [100], [101], [102], [63, 103], [104], [105], [106], [108], [112], [113], [114], [116], [94, 109, 119], [95, 110, 115, 120], [63, 118, 123], [95, 110, 115, 125], [111, 121, 126]}.

In Set 126, K=15 and M=96;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [96], [97], [98], [99], [100], [101], [102], [63, 93, 103], [104], [105], [106], [108], [112], [113], [114], [116], [95, 110, 115, 120], [63, 93, 118, 123], [94, 109, 119, 124], [95, 110, 115, 125], [111, 121, 126]}.

In Set 127, K=16 and M=96;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [96], [97], [98], [99], [100], [101], [102], [63, 93, 103], [104], [105], [106], [108], [112], [113], [114], [111, 116], [95, 110, 115, 120], [111, 121], [107, 117, 122], [94, 109, 119, 124]}.

In Set 128, K=17 and M=96;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [96], [97], [98], [99], [100], [101], [102], [63, 93, 103], [104], [105], [106], [108], [112], [113], [114], [111, 116], [95, 110, 115, 120], [107, 117, 122], [94, 109, 119, 124]}.

In Set 129, K=18 and M=96;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [62], [64], [65], [66], [67], [68], [69], [70], [71], [72], [73], [74], [75], [76], [77], [78], [79], [80], [81], [82], [83], [84], [85], [86], [87], [88], [89], [90], [91], [92], [96], [97], [98], [99], [100], [101], [102], [63, 93, 103], [104], [105], [106], [108], [112], [113], [114], [111, 116], [95, 110, 115, 120], [94, 109, 119, 124]}.

In Set 130, K=19 and M=96;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [64], [65], [66], [67], [68], [69], [70], [71], [72], [73], [74], [75], [76], [77], [78], [79], [80], [81], [82], [83], [84], [85], [86], [62, 87], [88], [89], [90], [92], [96], [97], [98], [99], [100], [101], [102], [104], [105], [106], [108], [112], [113], [94, 109, 114], [91, 111, 116], [95, 110, 115, 120], [91, 111, 121], [62, 107, 117, 122], [94, 109, 119, 124]}.

In Set 131, K=20 and M=96;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [61], [64], [65], [66], [67], [68], [69], [70], [71], [72], [73], [74], [75], [76], [77], [78], [79], [80], [81], [82], [83], [84], [85], [86], [62, 87], [88], [89], [90], [92], [96], [97], [98], [99], [100], [101], [102], [104], [105], [106], [63, 93, 103, 108], [112], [113], [94, 109, 114], [91, 111, 116], [95, 110, 115, 120], [62, 107, 117, 122], [94, 109, 119, 124]}.

In Set 132, K=21 and M=96;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [64], [65], [66], [67], [68], [69], [70], [71], [72], [73], [74], [75], [76], [77], [78], [79], [80], [81], [82], [83], [84], [85], [86], [62, 87], [88], [89], [90], [92], [96], [97], [98], [99], [100], [101], [102], [104], [105], [106], [63, 93, 103, 108], [112], [113], [94, 109, 114],

[61, 91, 111, 116], [95, 110, 115, 120], [62, 107, 117, 122], [94, 109, 119, 124]}.

In Set 133, K=22 and M=96;
P={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31]} and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30], [31], [32], [33], [34], [35], [36], [37], [38], [39], [40], [41], [42], [43], [44], [45], [46], [47], [48], [49], [50], [51], [52], [53], [54], [55], [56], [57], [58], [59], [60], [64], [65], [66], [67], [68], [69], [70], [71], [72], [73], [74], [75], [76], [77], [78], [79], [80], [81], [82], [83], [84], [85], [86], [62, 87], [88], [89], [90], [92], [96], [97], [98], [99], [100], [101], [102], [104], [105], [106], [63, 93, 103, 108], [112], [63, 93, 103, 113], [94, 109, 114], [61, 91, 111, 116], [95, 110, 115, 120], [94, 109, 119, 124]}.

Detailed construction parameters with better performance that are obtained based on any one of the foregoing embodiments of this application are specifically as follows:

If J' is 6 and M=48 or 64, detailed construction parameters of polar code for which K=12 to 22 are as follows:

In Set 134, K=12 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [43], [44], [48], [49], [50], [52], [56], [53, 58], [30, 45, 55, 60], [31, 46, 51, 61], [47, 57, 62]}.

In Set 135, K=13 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [44], [48], [49], [50], [52], [31, 46, 51, 56], [43, 53, 58], [30, 45, 55, 60], [31, 46, 51, 61], [47, 57, 62]}.

In Set 136, K=14 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [52], [31, 46, 51, 56], [43, 53, 58], [30, 45, 55, 60], [31, 46, 51, 61], [47, 57, 62]}.

In Set 137, K=15 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [52], [31, 46, 51, 56], [43, 53, 58], [30, 45, 55, 60], [47, 57, 62]}.

In Set 138, K=16 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [47, 52], [31, 46, 51, 56], [43, 53, 58], [30, 45, 55, 60]}.

In Set 139, K=17 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [44], [48], [49], [50], [27, 47, 52], [30, 45, 55], [29, 39, 54, 59], [31, 46, 51, 56, 61], [27, 47, 57, 62]}.

In Set 140, K=18 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [44], [48], [49], [30, 45, 50], [27, 47, 52], [29, 39, 54, 59], [31, 46, 51, 56, 61], [27, 47, 57, 62]}.

In Set 141, K=19 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [29, 39, 44], [48], [49], [30, 45, 50], [27, 47, 52], [31, 46, 51, 56], [30, 45, 55, 60]}.

In Set 142, K=20 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [29, 39, 44], [48], [29, 39, 49], [30, 45, 50], [27, 47, 52], [31, 46, 51, 56]}.

In Set 143, K=21 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [27, 42], [29, 39, 44], [48], [29, 39, 49], [30, 45, 50], [27, 47, 52], [31, 46, 51, 56]}.

In Set 144, K=22 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [24], [25], [26], [23, 28], [32], [33], [34], [35], [36], [37], [38], [40], [41], [27, 42], [48], [29, 39, 44, 49], [30, 45, 50], [27, 47, 52], [31, 46, 51, 56]}.

In Set 145, K=12 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [43], [44], [48], [49], [50], [52], [30, 45, 55], [56], [54, 59], [31, 46, 51, 61], [47, 57, 62]}.

In Set 146, K=13 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34],

[35], [36], [37], [38], [39], [40], [41], [42], [44], [48], [49], [50], [52], [30, 45, 55], [31, 46, 51, 56], [54, 59], [31, 46, 51, 61], [47, 57, 62]}.

In Set 147, K=14 and M=64;

P=Null set; and

F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [52], [30, 45, 55], [31, 46, 51, 56], [29, 54, 59], [31, 46, 51, 61], [47, 57, 62]}.

In Set 148, K=15 and M=64;

P=Null set; and

F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [52], [30, 45, 55], [29, 54, 59], [31, 46, 51, 56, 61], [47, 57, 62]}.

In Set 149, K=16 and M=64;

P=Null set; and

F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [47, 52], [31, 46, 51, 56], [31, 46, 51, 61], [47, 57, 62]}.

In Set 150, K=17 and M=64;

P=Null set; and

F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [44], [48], [49], [50], [27, 47, 52], [30, 45, 55], [29, 39, 54, 59], [31, 46, 51, 56, 61], [27, 47, 57, 62]}.

In Set 151, K=18 and M=64;

P=Null set; and

F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [44], [48], [49], [30, 45, 50], [27, 47, 52], [29, 39, 54, 59], [31, 46, 51, 56, 61], [27, 47, 57, 62]}.

In Set 152, K=19 and M=64;

P=Null set; and

F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42], [29, 39, 44], [48], [49], [30, 45, 50], [27, 47, 52], [31, 46, 51, 56], [23, 43, 53, 58], [30, 45, 55, 60]}.

In Set 153, K=20 and M=64;

P=Null set; and

F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42], [29, 39, 44], [48], [29, 39, 49], [30, 45, 50], [27, 47, 52], [31, 46, 51, 56], [30, 45, 55, 60]}.

In Set 154, K=21 and M=64;

P=Null set; and

F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42], [29, 39, 44], [48], [29, 39, 49], [30, 45, 50], [27, 47, 52], [31, 46, 51, 56]}.

In Set 155, K=22 and M=64;

P=Null set; and

F/PF={[0], [1], [2], [3], [4], [5], [6], [7], [8], [9], [10], [11], [12], [13], [14], [16], [17], [18], [19], [20], [21], [22], [24], [25], [26], [28], [32], [33], [34], [35], [36], [37], [38], [40], [41], [27, 42], [29, 39, 44], [48], [29, 39, 49], [15, 30, 45, 50], [27, 47, 52], [31, 46, 51, 56]}.

Based on the foregoing embodiments, this application further provides the following extended embodiment:

A check equation construction process is as follows: For each check bit position in a vector corresponding to each check bit position, several information bit positions whose row numbers are less than a row number of the check bit position are selected (by using a modulo 5 cyclic shift register). A check equation is constructed by using these information bit positions and the currently selected check bit position. Each check bit position in each check bit position vector is traversed in this way until all possible check equations are constructed, to form a check equation set. Certainly, in the check equation construction process, no information bit position may be selected. A check equation obtained in this way includes only one element indicating a check bit position. In this case, the check bit position is equivalent to a frozen bit position.

When a check equation cannot be constructed by using a selected check bit position according to a check equation generation rule (for example, by using the modulo 5 cyclic shift register), to be specific, no information bit can be checked by using the check bit position, it may be considered that a frozen bit position is checked by using the check bit position. Therefore, an actual quantity of available constructed check equations may be less than J'. In this scenario, if J' check equations need to be constituted, a quantity of check equations is increased to J' by using the following two manners:

In manner 1, after K+J' most reliable bit positions are removed from all sub-channels (bit positions) in descending order of reliability, remaining bit positions are selected as check bit positions, to continue check equation construction, until J' check equations can be constituted.

In manner 2, after K+J' most reliable bit positions are removed from all sub-channels (bit positions) in descending order of bit position sequence numbers, remaining bit positions are selected as check bit positions, to continue check equation construction, until J' check equations can be constituted.

Optionally, when J'=6, M=48 or 64, and K=12 to 22, construction parameters that include at least a quantity of effective check equations that is less than 6 are optimized in the manner 1. Selected formulas are the formulas used in steps 1 to 8 in the foregoing embodiment. Optimized construction parameters that include a quantity of constructed check equations that reaches 6 are specifically as follows:

In Set 156, K=12 and M=48;

P={[0], [1], [2], [3], [4], [5], [6], [7], [8], [9], [10], [11], [12], [13], [14], [15]}; and F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [43], [44], [48], [49], [50], [47, 52], [31, 46, 51, 56], [53, 58], [30, 45, 55, 60], [31, 46, 51, 61], [47, 57, 62]}.

In Set 157, K=13 and M=48;

P={[0], [1], [2], [3], [4], [5], [6], [7], [8], [9], [10], [11], [12], [13], [14], [15]}; and F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [44], [48], [49], [50], [47, 52], [31, 46, 51, 56], [43, 53, 58], [30, 45, 55, 60], [31, 46, 51, 61], [47, 57, 62]}.

In Set 158, K=14 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [52], [31, 46, 51, 56], [43, 53, 58], [30, 45, 55, 60], [31, 46, 51, 61], [47, 57, 62]}.

In Set 159, K=15 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [47, 52], [31, 46, 51, 56], [47, 57], [43, 53, 58], [30, 45, 55, 60]}.

In Set 160, K=16 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [30, 45, 50], [47, 52], [31, 46, 51, 56], [43, 53, 58], [30, 45, 55, 60]}.

In Set 161, K=17 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [40], [41], [42], [29, 39, 44], [48], [49], [30, 45, 50], [47, 52], [31, 46, 51, 56], [43, 53, 58], [30, 45, 55, 60]}.

In Set 162, K=18 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [29, 39, 44], [48], [49], [30, 45, 50], [27, 47, 52], [31, 46, 51, 56], [43, 53, 58], [30, 45, 55, 60]}.

In Set 163, K=19 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [29, 39, 44], [48], [29, 39, 49], [30, 45, 50], [27, 47, 52], [31, 46, 51, 56], [30, 45, 55, 60]}.

In Set 164, K=20 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [29, 39, 44], [48], [29, 39, 49], [30, 45, 50], [27, 47, 52], [31, 46, 51, 56], [30, 45, 55, 60]}.

In Set 165, K=21 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [27, 42], [29, 39, 44], [48], [29, 39, 49], [27, 47, 52], [31, 46, 51, 56], [30, 45, 50, 55, 60]}.

In Set 166, K=22 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [24], [25], [26], [23, 28], [32], [33], [34], [35], [36], [37], [38], [40], [41], [27, 42], [48], [29, 39, 44, 49], [30, 45, 50], [27, 47, 52], [31, 46, 51, 56]}.

In Set 167, K=12 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [43], [44], [48], [49], [50], [47, 52], [31, 46, 51, 56], [53, 58], [30, 45, 55, 60], [31, 46, 51, 61], [47, 57, 62]}.

In Set 168, K=13 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [44], [48], [49], [50], [47, 52], [31, 46, 51, 56], [43, 53, 58], [30, 45, 55, 60], [31, 46, 51, 61], [47, 57, 62]}.

In Set 169, K=14 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [52], [31, 46, 51, 56], [43, 53, 58], [30, 45, 55, 60], [31, 46, 51, 61], [47, 57, 62]}.

In Set 170, K=15 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [47, 52], [31, 46, 51, 56], [47, 57], [43, 53, 58], [30, 45, 55, 60]}.

In Set 171, K=16 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [40], [41], [42], [44], [48], [49], [30, 45, 50], [47, 52], [31, 46, 51, 56], [47, 57], [43, 53, 58], [30, 45, 55, 60]}.

In Set 172, K=17 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [44], [48], [49], [30, 45, 50], [27, 47, 52], [31, 46, 51, 56], [27, 47, 57], [43, 53, 58], [30, 45, 55, 60]}.

In Set 173, K=18 and M=64;
P=Null set; and

F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [29, 39, 44], [48], [49], [30, 45, 50], [27, 47, 52], [31, 46, 51, 56], [43, 53, 58], [30, 45, 55, 60]}.

In Set 174, K=19 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42], [29, 39, 44], [48], [49], [30, 45, 50], [27, 47, 52], [31, 46, 51, 56], [23, 43, 53, 58], [30, 45, 55, 60]}.

In Set 175, K=20 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42], [29, 39, 44], [48], [29, 39, 49], [30, 45, 50], [27, 47, 52], [31, 46, 51, 56], [30, 45, 55, 60]}.

In Set 176, K=21 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [27, 42], [48], [29, 39, 44, 49], [30, 45, 50], [27, 47, 52], [31, 46, 51, 56], [30, 45, 55, 60]}.

In Set 177, K=22 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [23, 28], [32], [33], [34], [35], [36], [37], [38], [40], [41], [27, 42], [48], [29, 39, 44, 49], [30, 45, 50], [27, 47, 52], [31, 46, 51, 56]}.

Optionally, when J'=6, M=48 or 64, and K=12 to 22, construction parameters that include at least a quantity of effective check equations that is less than 6 are optimized in the manner 1. Selected optimization parameters are the values shown in Set L4 in the foregoing embodiment. Optimized construction parameters that include a quantity of constructed check equations that reaches 6 are specifically as follows:

In Set 178, K=12 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [43], [44], [48], [49], [50], [47, 52], [31, 46, 51, 56], [53, 58], [30, 45, 55, 60], [31, 46, 51, 61], [47, 57, 62]}.

In Set 179, K=13 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [44], [48], [49], [50], [47, 52], [31, 46, 51, 56], [43, 53, 58], [30, 45, 55, 60], [31, 46, 51, 61], [47, 57, 62]}.

In Set 180, K=14 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [52], [31, 46, 51, 56], [43, 53, 58], [30, 45, 55, 60], [31, 46, 51, 61], [47, 57, 62]}.

In Set 181, K=15 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [47, 52], [31, 46, 51, 56], [43, 53, 58], [30, 45, 55, 60], [47, 57, 62]}.

In Set 182, K=16 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [30, 45, 50], [47, 52], [31, 46, 51, 56], [43, 53, 58], [30, 45, 55, 60]}.

In Set 183, K=17 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [29, 44], [48], [49], [30, 45, 50], [47, 52], [31, 46, 51, 56], [30, 45, 55, 60]}.

In Set 184, K=18 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [29, 39, 44], [48], [49], [30, 45, 50], [27, 47, 52], [31, 46, 51, 56], [43, 53, 58], [30, 45, 55, 60]}.

In Set 185, K=19 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [29, 39, 44], [48], [29, 39, 49], [30, 45, 50], [27, 47, 52], [31, 46, 51, 56], [30, 45, 55, 60]}.

In Set 186, K=20 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [27, 42], [29, 39, 44], [48], [29, 39, 49], [30, 45, 50], [27, 47, 52], [31, 46, 51, 56]}.

In Set 187, K=21 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [27, 42], [48], [29, 39, 44], [48], [29, 39, 49], [30, 45, 50], [27, 47, 52], [31, 46, 51, 56]}.

In Set 188, K=22 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21],

[22], [24], [25], [26], [23, 28], [32], [33], [34], [35], [36], [37], [38], [40], [41], [27, 42], [48], [29, 39, 44, 49], [27, 47, 52], [31, 46, 51, 56], [30, 45, 50, 55, 60]}.

In Set 189, K=12 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [43], [44], [48], [49], [50], [47, 52], [30, 45, 55], [31, 46, 51, 56], [54, 59], [31, 46, 51, 61], [47, 57, 62]}.

In Set 190, K=13 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [41], [42], [44], [48], [49], [50], [47, 52], [30, 45, 55], [31, 46, 51, 56], [54, 59], [31, 46, 51, 61], [47, 57, 62]}.

In Set 191, K=14 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [52], [30, 45, 55], [31, 46, 51, 56], [29, 54, 59], [31, 46, 51, 61], [47, 57, 62]}.

In Set 192, K=15 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [50], [47, 52], [31, 46, 51, 56], [30, 45, 55, 60], [31, 46, 51, 61], [47, 57, 62]}.

In Set 193, K=16 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [30, 45, 50], [47, 52], [31, 46, 51, 56], [31, 46, 51, 61], [47, 57, 62]}.

In Set 194, K=17 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [44], [48], [49], [30, 45, 50], [27, 47, 52], [31, 46, 51, 56], [27, 47, 57], [43, 53, 58], [30, 45, 55, 60]}.

In Set 195, K=18 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [29, 39, 44], [48], [49], [30, 45, 50], [27, 47, 52], [31, 46, 51, 56], [43, 53, 58], [30, 45, 55, 60]}.

In Set 196, K=19 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42], [29, 39, 44], [48], [49], [30, 45, 50], [27, 47, 52], [31, 46, 51, 56], [23, 43, 53, 58], [30, 45, 55, 60]}.

In Set 197, K=20 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [42], [29, 39, 44], [48], [29, 39, 49], [30, 45, 50], [27, 47, 52], [31, 46, 51, 56], [30, 45, 55, 60]}.

In Set 198, K=21 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [27, 42], [29, 39, 44], [48], [29, 39, 49], [30, 45, 50], [27, 47, 52], [31, 46, 51, 56]}.

In Set 199, K=22 and M=64;
P=Null set; and
F/PF={[0], [1], [2], [3], [4], [5], [6], [7], [8], [9], [10], [11], [12], [13], [14], [16], [17], [18], [19], [20], [21], [22], [24], [25], [26], [28], [32], [33], [34], [35], [36], [37], [38], [40], [41], [27, 42], [29, 39, 44], [48], [29, 39, 49], [15, 30, 45, 50], [27, 47, 52], [31, 46, 51, 56]}.

Optionally, when J'=6, M=48, and K=12 to 22, construction parameters that include at least a quantity of effective check equations that is less than 8 are optimized in the manner 1. Selected formulas are the formulas used in steps 1 to 8 in the foregoing embodiment. Optimized construction parameters that include a quantity of constructed check equations that reaches 8 are specifically as follows:

In Set 200, K=12 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [31, 41], [42], [43], [44], [48], [49], [30, 45, 50], [47, 52], [31, 46, 51, 56], [53, 58], [30, 45, 55, 60], [31, 46, 51, 61], [47, 57, 62]}.

In Set 201, K=13 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [31, 41], [42], [44], [48], [49], [30, 45, 50], [47, 52], [31, 46, 51, 56], [43, 53, 58], [30, 45, 55, 60], [31, 46, 51, 61], [47, 57, 62]}.

In Set 202, K=14 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [30, 45, 50], [47, 52], [31, 46, 51, 56], [43, 53, 58], [30, 45, 55, 60], [31, 46, 51, 61], [47, 57, 62]}.

In Set 203, K=15 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [29, 44], [48], [49], [30, 45, 50], [47, 52], [31, 46, 51, 56], [47, 57], [43, 53, 58], [30, 45, 55, 60]}.

In Set 204, K=16 and M=48;
P={[0], [1], [2], [3], [4], [5], [6], [7], [8], [9], [10], [11], [12], [13], [14], [15]}; and F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [29, 44], [48], [29, 49], [30, 45, 50], [47, 52], [31, 46, 51, 56], [43, 53, 58], [30, 45, 55, 60]}.

In Set 205, K=17 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [40], [31, 41], [42], [29, 39, 44], [48], [29, 39, 49], [30, 45, 50], [47, 52], [31, 46, 51, 56], [43, 53, 58], [30, 45, 55, 60]}.

In Set 206, K=18 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [27, 42], [29, 39, 44], [48], [29, 39, 49], [30, 45, 50], [27, 47, 52], [31, 46, 51, 56], [43, 53, 58], [30, 45, 55, 60]}.

In Set 207, K=19 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [31, 41], [27, 42], [29, 39, 44], [48], [29, 39, 49], [30, 45, 50], [27, 47, 52], [31, 46, 51, 56], [30, 45, 55, 60]}.

In Set 208, K=20 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [24], [25], [26], [23, 28], [32], [33], [34], [35], [36], [37], [38], [40], [41], [27, 42], [29, 39, 44], [48], [29, 39, 49], [30, 45, 50], [27, 47, 52], [31, 46, 51, 56], [30, 45, 55, 60]}.

In Set 209, K=21 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [24], [25], [26], [23, 28], [32], [33], [34], [35], [36], [37], [38], [40], [31, 41], [27, 42], [29, 39, 44], [48], [29, 39, 49], [27, 47, 52], [31, 46, 51, 56], [30, 45, 50, 55, 60]}.

In Set 210, K=22 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [24], [25], [26], [23, 28], [32], [33], [34], [35], [36], [37], [23, 38], [40], [31, 41], [27, 42], [48], [29, 39, 44, 49], [30, 45, 50], [27, 47, 52], [31, 46, 51, 56]}.

In Set 211, K=12 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [31, 41], [42], [43], [44], [48], [49], [30, 45, 50], [47, 52], [31, 46, 51, 56], [53, 58], [30, 45, 55, 60], [31, 46, 51, 61], [47, 57, 62]}.

In Set 212, K=13 and M=64;
P=Null set; and

F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [31, 41], [42], [44], [48], [49], [30, 45, 50], [47, 52], [31, 46, 51, 56], [43, 53, 58], [30, 45, 55, 60], [31, 46, 51, 61], [47, 57, 62]}.

In Set 213, K=14 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [30, 45, 50], [47, 52], [31, 46, 51, 56], [43, 53, 58], [30, 45, 55, 60], [31, 46, 51, 61], [47, 57, 62]}.

In Set 214, K=15 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [29, 44], [48], [49], [30, 45, 50], [47, 52], [31, 46, 51, 56], [47, 57], [43, 53, 58], [30, 45, 55, 60]}.

In Set 215, K=16 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [40], [41], [42], [29, 39, 44], [48], [29, 39, 49], [30, 45, 50], [47, 52], [31, 46, 51, 56], [47, 57], [43, 53, 58], [30, 45, 55, 60]}.

In Set 216, K=17 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [29, 39, 44], [48], [29, 39, 49], [30, 45, 50], [27, 47, 52], [31, 46, 51, 56], [27, 47, 57], [43, 53, 58], [30, 45, 55, 60]}.

In Set 217, K=18 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [27, 42], [29, 39, 44], [48], [29, 39, 49], [30, 45, 50], [27, 47, 52], [31, 46, 51, 56], [43, 53, 58], [30, 45, 55, 60]}.

In Set 218, K=19 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [27, 42], [29, 39, 44], [48], [29, 39, 49], [30, 45, 50], [27, 47, 52], [31, 46, 51, 56], [23, 43, 53, 58], [30, 45, 55, 60]}.

In Set 219, K=20 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [23, 28], [32], [33], [34], [35], [36], [37], [38], [40], [41], [27, 42], [29, 39, 44], [48], [29, 39, 49], [30, 45, 50], [27, 47, 52], [31, 46, 51, 56], [30, 45, 55, 60]}.

In Set 220, K=21 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [23, 28], [32], [33], [34], [35], [36],

[37], [38], [40], [31, 41], [27, 42], [48], [29, 39, 44, 49], [30, 45, 50], [27, 47, 52], [31, 46, 51, 56], [30, 45, 55, 60]}.

In Set 221, K=22 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [23, 28], [32], [33], [34], [35], [36], [37], [23, 38], [40], [31, 41], [27, 42], [48], [29, 39, 44, 49], [30, 45, 50], [27, 47, 52], [31, 46, 51, 56]}.

Optionally, when J'=6, M=48, and K=12 to 22, construction parameters that include at least a quantity of effective check equations that is less than 8 are optimized in the manner 1. Selected optimization parameters are the values shown in Table 4 in the foregoing embodiment. Optimized construction parameters that include a quantity of constructed check equations that reaches 8 are specifically as follows:

In Set 222, K=12 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [31, 41], [42], [43], [44], [48], [49], [30, 45, 50], [47, 52], [31, 46, 51, 56], [53, 58], [30, 45, 55, 60], [31, 46, 51, 61], [47, 57, 62]}.

In Set 223, K=13 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [31, 41], [42], [44], [48], [49], [30, 45, 50], [47, 52], [31, 46, 51, 56], [43, 53, 58], [30, 45, 55, 60], [31, 46, 51, 61], [47, 57, 62]}.

In Set 224, K=14 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [44], [48], [49], [30, 45, 50], [47, 52], [31, 46, 51, 56], [43, 53, 58], [30, 45, 55, 60], [31, 46, 51, 61], [47, 57, 62]}.

In Set 225, K=15 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [29, 44], [48], [49], [30, 45, 50], [47, 52], [31, 46, 51, 56], [43, 53, 58], [30, 45, 55, 60], [47, 57, 62]}.

In Set 226, K=16 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [29, 44], [48], [29, 49], [30, 45, 50], [47, 52], [31, 46, 51, 56], [43, 53, 58], [30, 45, 55, 60]}.

In Set 227, K=17 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [31, 41], [42], [29, 44], [48], [29, 49], [30, 45, 50], [47, 52], [31, 46, 51, 56], [30, 45, 55, 60]}.

In Set 228, K=18 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [27, 42], [29, 39, 44], [48], [29, 39, 49], [30, 45, 50], [27, 47, 52], [31, 46, 51, 56], [43, 53, 58], [30, 45, 55, 60]}.

In Set 229, K=19 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [31, 41], [27, 42], [29, 39, 44], [48], [29, 39, 49], [30, 45, 50], [27, 47, 52], [31, 46, 51, 56], [30, 45, 55, 60]}.

In Set 230, K=20 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [27, 37], [38], [40], [31, 41], [27, 42], [29, 39, 44], [48], [29, 39, 49], [30, 45, 50], [27, 47, 52], [31, 46, 51, 56]}.

In Set 231, K=21 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [24], [25], [26], [23, 28], [32], [33], [34], [35], [36], [37], [38], [40], [31, 41], [27, 42], [29, 39, 44], [48], [29, 39, 49], [30, 45, 50], [27, 47, 52], [31, 46, 51, 56]}.

In Set 232, K=22 and M=48;
P={[0], [1], [2], [3], [4], [5], [6], [7], [8], [9], [10], [11], [12], [13], [14], [15]}; and
F/PF={[0], [1], [2], [3], [4], [5], [6], [7], [8], [9], [10], [11], [12], [13], [14], [15], [16], [17], [18], [19], [20], [21], [22], [24], [25], [26], [23, 28], [32], [33], [34], [35], [36], [37], [23, 38], [40], [31, 41], [27, 42], [48], [29, 39, 44, 49], [27, 47, 52], [31, 46, 51, 56], [30, 45, 50, 55, 60]}.

In Set 233, K=12 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [31, 41], [42], [43], [44], [48], [49], [30, 45, 50], [47, 52], [30, 45, 55], [31, 46, 51, 56], [54, 59], [31, 46, 51, 61], [47, 57, 62]}.

In Set 234, K=13 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [32], [33], [34], [35], [36], [37], [38], [39], [40], [31, 41], [42], [44], [48], [49], [30, 45, 50], [47, 52], [30, 45, 55], [31, 46, 51, 56], [54, 59], [31, 46, 51, 61], [47, 57, 62]}.

In Set 235, K=14 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35],

[36], [37], [38], [29, 39], [40], [41], [42], [44], [48], [49], [30, 45, 50], [47, 52], [30, 45, 55], [31, 46, 51, 56], [29, 54, 59], [31, 46, 51, 61], [47, 57, 62]}.

In Set 236, K=15 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [29, 44], [48], [49], [30, 45, 50], [47, 52], [31, 46, 51, 56], [30, 45, 55, 60], [31, 46, 51, 61], [47, 57, 62]}.

In Set 237, K=16 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [27], [28], [32], [33], [34], [35], [36], [37], [38], [29, 39], [40], [41], [42], [29, 44], [48], [29, 49], [30, 45, 50], [47, 52], [31, 46, 51, 56], [31, 46, 51, 61], [47, 57, 62]}.

In Set 238, K=17 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [42], [29, 39, 44], [48], [29, 39, 49], [30, 45, 50], [27, 47, 52], [31, 46, 51, 56], [27, 47, 57], [43, 53, 58], [30, 45, 55, 60]}.

In Set 239, K=18 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [23], [24], [25], [26], [28], [32], [33], [34], [35], [36], [37], [38], [40], [41], [27, 42], [29, 39, 44], [48], [29, 39, 49], [30, 45, 50], [27, 47, 52], [31, 46, 51, 56], [43, 53, 58], [30, 45, 55, 60]}.

In Set 240, K=19 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [28], [32], [33], [34], [35], [36], [37], [38], [40], [41], [27, 42], [29, 39, 44], [48], [29, 39, 49], [30, 45, 50], [27, 47, 52], [31, 46, 51, 56], [23, 43, 53, 58], [30, 45, 55, 60]}.

In Set 241, K=20 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [23, 28], [32], [33], [34], [35], [36], [37], [38], [40], [41], [27, 42], [29, 39, 44], [48], [29, 39, 49], [30, 45, 50], [27, 47, 52], [31, 46, 51, 56], [30, 45, 55, 60]}.

In Set 242, K=21 and M=64;
P=Null set; and
F/PF={[0], [1], [2], [3], [4], [5], [6], [7], [8], [9], [10], [11], [12], [13], [14], [15], [16], [17], [18], [19], [20], [21], [22], [24], [25], [26], [23, 28], [32], [33], [34], [35], [36], [37], [38], [40], [31, 41], [27, 42], [29, 39, 44], [48], [29, 39, 49], [30, 45, 50], [27, 47, 52], [31, 46, 51, 56]}.

In Set 243, K=22 and M=64;
P=Null set; and
F/PF={[0], [1], [2], [3], [4], [5], [6], [7], [8], [9], [10], [11], [12], [13], [14], [16], [17], [18], [19], [20], [21], [22], [24], [25], [26], [23, 28], [32], [33], [34], [35], [36], [37], [38], [40], [31, 41], [27, 42], [29, 39, 44], [48], [29, 39, 49], [15, 30, 45, 50], [27, 47, 52], [31, 46, 51, 56]}.

Based on any one of the foregoing embodiments of this application, the embodiments of this application further provide the following extended embodiment:

Another possible M other than 48, 64, 80, and 96 may be independently designed, or a design of another possible M may be obtained in a repetition manner based on the foregoing embodiments of M=48, 64, 80, and 96. The repetition manner includes but is not limited to: performing repetition in descending order (or ascending order) of reliability, performing repetition in descending order (or ascending order) of bit position sequence numbers, or performing repetition in bit reversal order in descending order (or ascending order).

Based on any one of the foregoing embodiments of this application, the embodiments of this application further provide the following extended embodiment:

Check bits can be placed at positions whose row weights are $w_{min}$ or $2w_{min}$ (any one of the $w_{min}$ and $2w_{min}$ positions is determined as a PC bit, and the determining is not necessarily based on reliability). In addition, this manner may be combined with another manner. For example, bit positions of K information bits and J' check bits are determined based on the information bits and relative positions of the check bits in the information bits (for example, the check bits are distributed in the information bits at equal intervals or in proportion). For example, if an information bit length K=8, an information bit sequence is $[u_0, u_1, u_2, \ldots, u_7]$, and J'=2, an information bit and check bit sequence is $[u_0, u_1, p_1, u_2, \ldots, u_6, p_2, u_7]$. K+J'=10 highest-reliability bit positions are determined, and bit positions of $p_1$ and $p_2$ are check bit positions.

Based on any one of the foregoing embodiments of this application, the embodiments of this application further provide the following extended embodiment:

Any one of the foregoing embodiments of the PC-polar encoding/decoding method in this application may also be used in combination with an existing CA-polar encoding/decoding method. There may be three, four, or five CA-polar CRC bits. A polynomial of three CRC bits is $x^3+x+1$, a polynomial of four CRC bits is $x^4+x^3+x^2+x+1$, and a polynomial of five CRC bits is $x^5+x^4+x^3+x^2+1$.

When there are CRC bits, construction parameters of polar code may be obtained in the following Table 8 and Table 9.

TABLE 8

| $w_{min}$, $J_1'$, $J_2'$ | K = 12 | K = 13 | K = 14 | K = 15 | K = 16 | K = 17 | K = 18 | K = 19 | K = 20 | K = 21 | K = 22 |
|---|---|---|---|---|---|---|---|---|---|---|---|
| M = 48 | 16, 1, 0 | 16, 0, 1 | 8, 1, 1 | 16, 0, 0 | 8, 0, 0 | 8, 0, 1 | 8, 0, 0 | 8, 0, 0 | 8, 0, 0 | 8, 0, 0 | 8, 0, 0 |
| M = 64 | 16, 0, 1 | 16, 0, 1 | 16, 0, 1 | 8, 1, 0 | 8, 0, 0 | 8, 2, 0 | 8, 0, 0 | 8, 0, 1 | 8, 0, 0 | 8, 0, 0 | 8, 2, 0 |
| M = 96 | 32, 0, 0 | 32, 0, 0 | 32, 0, 0 | 32, 0, 0 | 32, 0, 0 | 32, 0, 0 | 32, 0, 0 | 32, 0, 0 | 16, 0, 0 | 16, 0, 0 | 16, 0, 0 |
| M = 128 | 32, 0, 0 | 32, 0, 0 | 32, 0, 0 | 32, 0, 0 | 32, 0, 0 | 32, 0, 0 | 32, 0, 0 | 32, 0, 0 | 16, 0, 0 | 16, 0, 0 | 16, 0, 0 |

TABLE 9

| $w_{min}$, $J_1'$, $J_2'$ | K = 12 | K = 13 | K = 14 | K = 15 | K = 16 | K = 17 | K = 18 | K = 19 | K = 20 | K = 21 | K = 22 |
|---|---|---|---|---|---|---|---|---|---|---|---|
| M = 48 | 16, 1, 0 | 16, 1, 0 | 16, 1, 0 | 16, 0, 0 or 16, 1, 0 | 8, 0, 0 or 16, 0, 0 | 8, 0, 0 or 16, 0, 0 | 8, 0, 0 or 16, 0, 0 | 8, 0, 0 | 8, 0, 0 | 8, 0, 0 | 8, 0, 0 |
| M = 64 | 16, 1, 0 | 16, 1, 0 | 16, 1, 0 | 8, 1, 0 or 8, 0, 0 or 16, 0, 0 or 16, 1, 0 | 8, 1, 0 or 8, 0, 0 or 16, 0, 0 | 8, 1, 0 or 8, 0, 0 or 16, 0, 0 | 8, 0, 0 or 16, 0, 0 | 8, 0, 0 | 8, 0, 0 | 8, 0, 0 | 8, 0, 0 |
| M = 96 | 32, 1, 0 | 32, 1, 0 | 32, 1, 0 | 32, 1, 0 | 32, 1, 0 | 32, 1, 0 | 32, 1, 0 | 32, 1, 0 | 16, 1, 0 | 16, 1, 0 | 16, 1, 0 |
| M = 128 | 32, 1, 0 | 32, 1, 0 | 32, 1, 0 | 32, 1, 0 | 32, 1, 0 | 32, 1, 0 | 32, 1, 0 | 32, 1, 0 | 16, 1, 0 | 16, 1, 0 | 16, 1, 0 |

In the foregoing embodiments of this application, the PC-polar has an obvious performance advantage compared with the CA-polar with a different CRC bit quantity.

Figure 6:
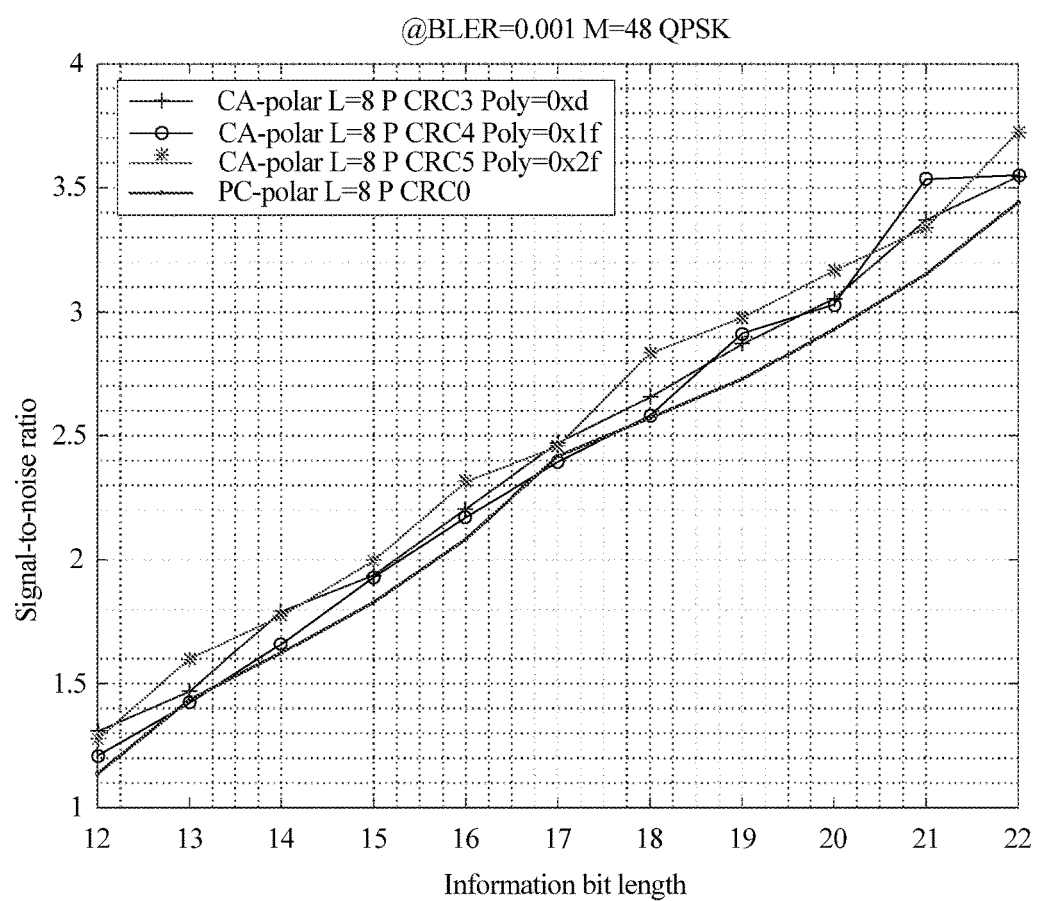
FIG. 6 is a performance comparison between a method for polar coding according to an embodiment this application and the polar coding scheme shown in FIG. 3.

FIG. 6 is a schematic diagram of performance comparison between PC-polar code and CA-polar code when M=48 and K=12 to 22. A polynomial of three CRC bits is 0xd ($x^3+x+1$). Based on FIG. 6, the PC-polar code has better overall performance than the CA-polar code.

Figure 7:
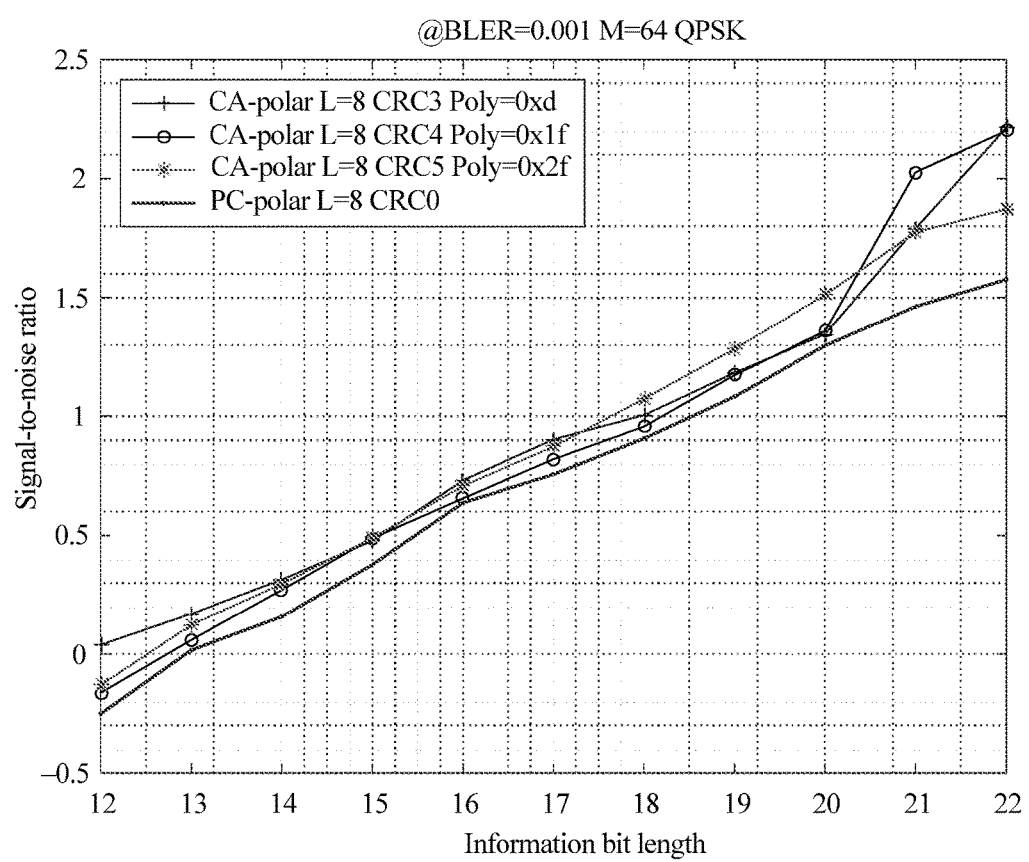
FIG. 7 is another performance comparison between a polar coding/decoding method according to an embodiment this application and the polar encoding scheme shown in FIG. 3.

FIG. 7 is a schematic diagram of performance comparison between PC-polar code and CA-polar code when M=64 and K=12 to 22. A polynomial of three CRC bits is 0xd ($x^3+x+1$). Based on FIG. 7, the PC-polar code has better overall performance than the CA-polar code.

Figure 8:
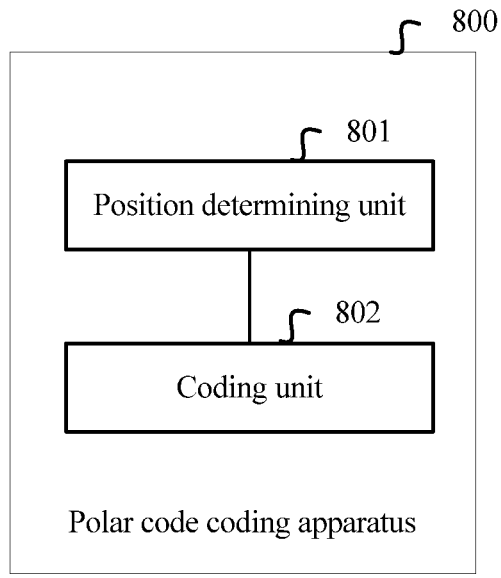
FIG. 8 is a block diagram of a polar coding apparatus according to an embodiment of this application.

Based on a same inventive concept as the polar encoding/decoding method provided in the foregoing embodiments of this application, as shown in FIG. 8, an embodiment of this application further provides a polar encoding apparatus 800. The polar encoding apparatus 800 includes a position determining unit 801 and a encoding/decoding unit 802. The position determining unit 801 and the coding unit 802 are corresponding function modules for implementing the method embodiments shown in FIGS. 5A and 5B. The polar encoding apparatus 800 can be configured to perform the polar encoding/decoding methods shown in FIGS. 5A and 5B. The polar encoding apparatus 800 may be the network device 100 or the terminal device 200 shown in FIG. 1.

Figure 9:
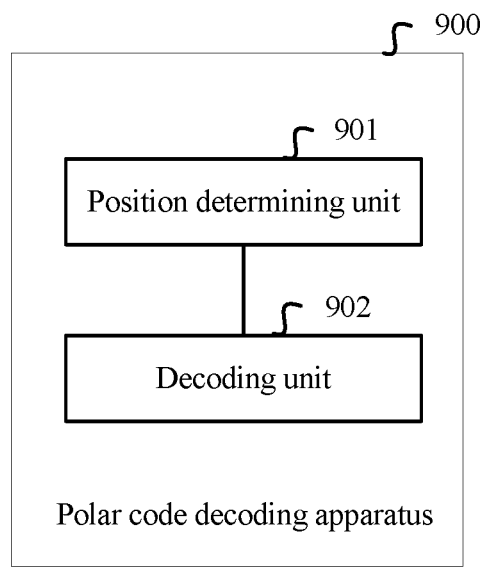
FIG. 9 is a block diagram of a polar decoding apparatus according to an embodiment of this application.

Based on a same inventive concept as the polar encoding/decoding method provided in the foregoing embodiments of this application, as shown in FIG. 9, an embodiment of this application further provides a polar decoding apparatus 900. The polar decoding apparatus 900 includes a position determining unit 901 and a decoding unit 902. The position determining unit 901 and the decoding unit 902 are corresponding function modules for implementing the method embodiments shown in FIGS. 5A and 5B. The polar decoding apparatus 900 can be configured to perform the polar encoding/decoding methods shown in FIGS. 5A and 5B. The polar decoding apparatus 900 may be the network device 100 or the terminal device 200 shown in FIG. 1.

Figure 10:
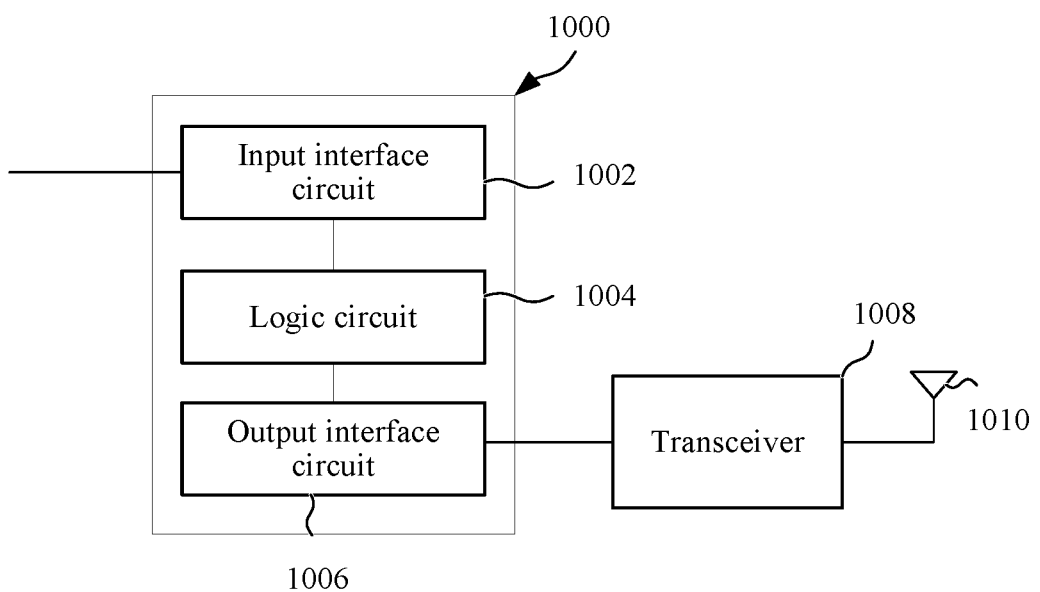
FIG. 10 is a simplified structural diagram of a polar encoding/decoding apparatus according to an embodiment of this application.

Based on a same inventive concept as the polar encoding/decoding method provided in the foregoing embodiments of this application, an embodiment of this application further provides a polar encoding/decoding apparatus configured to implement the polar encoding/decoding method in the foregoing embodiments. Some or all steps of the polar encoding/decoding method in the foregoing embodiments may be implemented by hardware or may be implemented by software. When the polar encoding/decoding method in the foregoing embodiments is implemented by hardware, as shown in FIG. 10, the polar encoding/decoding apparatus 1000 includes: an input interface circuit 1002, a logic circuit 1004, and an output interface circuit 1006. The polar encoding/decoding apparatus 1000 further includes a transceiver 1008 and an antenna 1010. The transceiver 1008 sends/receives data by using the antenna 1010.

The logic circuit 1004 is configured to perform the polar encoding/decoding method shown in FIG. 5. For details, refer to the descriptions in the foregoing method embodiments. The details are not described herein again. During specific implementation, the polar encoding/decoding apparatus 1000 may be a chip or an integrated circuit.

Figure 11:
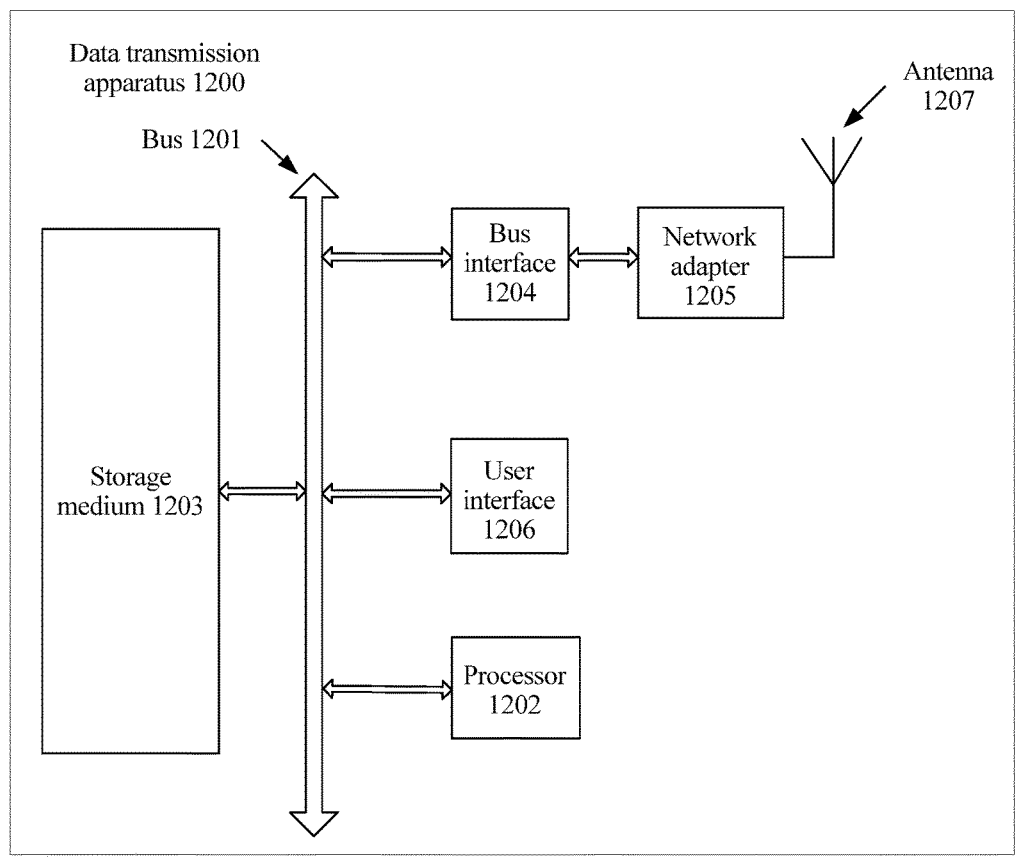
FIG. 11 is a simplified structural diagram of a data transmission apparatus according to an embodiment of this application.

Based on a same inventive concept as the polar encoding/decoding method provided in the foregoing embodiments of this application, an embodiment of this application further provides a data transmission apparatus. FIG. 11 is a schematic structural diagram of a data transmission apparatus (a communications apparatus such as an access point, a base station, a station, or a terminal device, or a chip on the communications apparatus) provided in the implementations of the present invention.

As shown in FIG. 11, a data transmission apparatus 1200 may be implemented by using a bus 1201 as a general bus architecture. Based on constraints on specific application and overall design of the data transmission apparatus 1200, the bus 1201 may include any quantity of interconnected buses and bridges. The bus 1201 connects various circuits together, and these circuits include a processor 1202, a storage medium 1203, and a bus interface 1204. Optionally, the data transmission apparatus 1200 uses the bus interface 1204 to connect a network adapter 1205 and the like by using the bus 1201. The network adapter 1205 may be configured to: implement a signal processing function of a physical layer in a wireless communications network (which is specifically a wireless local area network or the like if necessary), and send or receive a radio frequency signal by using an antenna 1207. A user interface 1206 may be connected to a user terminal, for example, a keyboard, a display, a mouse, or a joystick. The bus 1201 may be further connected to various other circuits, for example, a timing source, a peripheral device, a voltage regulator, and a power management circuit. These circuits are well-known in the art, and therefore are not described in detail herein.

Alternatively, the data transmission apparatus 1200 may be configured as a general processing system. For example, the general processing system is usually referred to as a chip. The general processing system includes one or more microprocessors that provide a processor function, and an external memory that is at least a part of the storage medium 1203. All these components are connected to other supporting circuits by using an external bus architecture.

Alternatively, the data transmission apparatus 1200 may be implemented by using an application-specific integrated circuit (ASIC) having the processor 1202, the bus interface 1204, and the user interface 1206, or by using at least a part of the storage medium 1203 integrated into a single chip. Alternatively, the data transmission apparatus 1200 may be implemented by using one or more of a field programmable gate array (FPGA), a programmable logic device (PLD), a controller, a state machine, gate logic, a discrete hardware component, any other appropriate circuit, or any combination of circuits that can perform the various functions described throughout the present invention.

The processor 1202 is responsible for bus management and general processing (including executing software stored in the storage medium 1203). The processor 1202 may be implemented by using one or more general purpose processors and/or dedicated processors. Examples of the processor include a microprocessor, a microcontroller, a DSP processor, and other circuits that can execute software. The software should be broadly construed as representation of an instruction, data, or any combination thereof, regardless of whether the software is referred to as software, firmware, middleware, microcode, a hardware description language, or the like.

The storage medium 1203 is separated from the processor 1202 as shown in FIG. 11. However, the storage medium 1203 or any part of the storage medium 1203 may be located outside the data transmission apparatus 1200. For example, the storage medium 1203 may include a transmission cable, a carrier waveform modulated by using data, and/or a computer product separated from a wireless node. All these media can be accessed by the processor 1202 by using the bus interface 1204. Alternatively, the storage medium 1203 or any part of the storage medium 1203 may be integrated into the processor 1202, for example, may be a cache and/or a general purpose register.

The processor 1202 may perform the polar encoding/decoding method in any one of the foregoing embodiments of this application. Specific content is not described herein again.

All or some of the foregoing embodiments may be implemented by software, hardware, firmware, or any combination thereof. When the embodiments are implemented by software, all or some of the embodiments may be implemented in a form of a computer program product. The computer program product includes one or more computer instructions. When the computer program instructions are loaded and executed on a computer, all or some of the procedures or functions according to the embodiments of the present invention are generated. The computer may be a general purpose computer, a dedicated computer, a computer network, or another programmable apparatus. The computer instructions may be stored in a computer readable storage medium, or may be transmitted from a computer readable storage medium to another computer readable storage medium. For example, the computer instructions may be transmitted from a website, a computer, a server, or a data center to another website, computer, server, or data center in a wired (for example, a coaxial cable, an optical fiber, or a digital subscriber line (DSL)) or wireless (for example, infrared, radio, or microwave) manner. The computer readable storage medium may be any usable medium accessible to a computer, or may be a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid state disk (SSD)), or the like.

What is claimed is:

1. A method for processing information bits, performed by a device in a wireless communication network, comprising:
   obtaining K information bits and a code length M, wherein the code length M is a length of an output sequence, wherein K, M are positive integers;
   generating a bit sequence, wherein the bit sequence has N bits, which include the K information bits and a number J' of parity check bits, wherein N≥K+J' and J'≥1;
   encoding the bit sequence, to obtain an N-bit encoded sequence;
   rate matching the N-bit encoded sequence, to obtain the output sequence; and
   outputting the output sequence;
   wherein when M−K>192, one of the parity check bits is placed in a bit position of the bit sequence, and the bit position is determined according to reliabilities of bit positions in the bit sequence for placing the K information bits and the J' parity check bits.

2. The method according to claim 1, wherein the bit position of the one of the parity check bits has a minimum row weight among the bit positions for placing the K information bits and the J' parity check bits.

3. The method according to claim 1, wherein bit positions in the bit sequence for placing the K information bits are determined according to reliabilities of remaining (K+J'−1) bit positions in the bit sequence for placing the K information bits and the J' parity check bits.

4. The method according to claim 1, wherein rate matching the N-bit encoded bit sequence, to obtain the output sequence comprises:
   removing N−M bits from the N-bit encoded bit sequence by puncturing or shortening the encoded bit sequence, to obtain the output sequence.

5. The method according to claim 1, wherein the K information bits comprise one or more cyclic redundancy check (CRC) bits.

6. The method according to claim 1, wherein encoding the bit sequence to obtain an N-bit encoded bit sequence comprises:
   encoding the bit sequence according to an encoding formula, to obtain the N-bit encoded bit sequence;
   wherein the encoding formula is:

$$x_1^N = u_1^N G_N$$

wherein $u_1^N = (u_1, u_2, \ldots, u_N)$ is a binary row vector representing the bit sequence, $x_1^N = (x_1, x_2, \ldots, x_N)$ is the encoded sequence, and $G_N$ is a polar code generating matrix of N rows and N columns.

7. A device in a wireless communication network, comprising a processor and a memory storing program instructions for execution by the processor;
   wherein when executed by the processor, the program instructions cause the device to:
      obtain K information bits and a code length M, wherein the code length M is a length of an output sequence, wherein K, M are positive integers;
      generate a bit sequence, wherein the bit sequence has N bits, which include the K information bits and a number J' of parity check bits, wherein N≥K+J' and J'≥1;
      encode the bit sequence, to obtain an N-bit encoded sequence; and
      rate match the N-bit encoded sequence, to obtain the output sequence;

wherein when M−K>192, one of the parity check bits is placed in a bit position of the bit sequence, and the bit position is determined according to reliabilities of bit positions in the bit sequence for placing the K information bits and the J' parity check bits.

8. The device according to claim 7, wherein the bit position of the one of the parity check bits has a minimum row weight among the bit positions for placing the K information bits and the J' parity check bits.

9. The device according to claim 7, wherein the program instructions further cause the device to:
wherein bit positions in the bit sequence for placing the K information bits are determined according to reliabilities of remaining (K+J'−1) bit positions in the bit sequence for placing the K information bits and the J' parity check bits.

10. The device according to claim 7, wherein in rate matching the N-bit encoded bit sequence, to obtain the output sequence, the program instructions cause the device to:
remove N−M bits from the N-bit encoded bit sequence by puncturing or shortening the encoded bit sequence, to obtain the output sequence.

11. The device according to claim 7, wherein the K information bits comprise one or more cyclic redundancy check (CRC) bits.

12. The device according to claim 7, wherein in encoding the bit sequence to obtain an N-bit encoded bit sequence, the program instructions cause the device to:
encode the bit sequence according to an encoding formula, to obtain the encoded bit sequence;
wherein the encoding formula is:

$$x_1^N = u_1^N G_N$$

wherein $u_1^N = (u_1, u_2, \ldots, u_N)$ is a binary row vector representing the bit sequence, $x_1^N = (x_1, x_2, \ldots, x_N)$ is the encoded sequence, and $G_N$ is a polar code generating matrix of N rows and N columns.

13. The device according to claim 7, wherein the device is a base station or a user terminal, and the program instructions further cause the device to:
output the output sequence.

14. A non-transitory computer readable medium storing program codes thereon for execution by a processor in a communication device, wherein the program codes comprise instructions for:
obtaining K information bits and a code length M, wherein the code length M is a length of an output sequence, wherein K, M are positive integers;
generating a bit sequence, wherein the bit sequence has N bits, which include the K information bits and a number J' of parity check bits, wherein N≥K+J' and J'≥1;
encoding the bit sequence, to obtain an N-bit encoded sequence;
rate matching the N-bit encoded sequence, to obtain the output sequence; and
outputting the output sequence;
wherein when M−K>192, one of the parity check bits is placed in a bit position of the bit sequence, and the bit position is determined according to reliabilities of bit positions in the bit sequence for placing the K information bits and the J' parity check bits.

15. The non-transitory computer readable medium according to claim 14, wherein the bit position of the one of the parity check bits has a minimum row weight among the bit positions for placing the K information bits and the J' parity check bits.

16. The non-transitory computer readable medium according to claim 14, wherein bit positions in the bit sequence for placing the K information bits are determined according to reliabilities of remaining (K+J'−1) bit positions in the bit sequence for placing the K information bits and the J' parity check bits.

17. The non-transitory computer readable medium according to claim 14, wherein rate matching the N-bit encoded bit sequence, to obtain the output sequence comprises:
removing N−M bits from the N-bit encoded bit sequence by puncturing or shortening the encoded bit sequence, to obtain the output sequence.

18. The non-transitory computer readable medium according to claim 14, wherein the K information bits comprise one or more cyclic redundancy check (CRC) check bits.

19. The non-transitory computer readable medium according to claim 14, wherein encoding the bit sequence to obtain an N-bit encoded bit sequence comprises:
encoding the bit sequence according to an encoding formula, to obtain the encoded bit sequence;
wherein the encoding formula is:

$$x_1^N = u_1^N G_N$$

wherein $u_1^N = (u_1, u_2, \ldots, u_N)$ is a binary row vector representing the bit sequence, $x_1^N = (x_1, x_2, \ldots, x_N)$ is the encoded bit sequence, and $G_N$ is a polar code generating matrix of N rows and N columns.

* * * * *